(12) United States Patent
Shimada et al.

(10) Patent No.: US 9,444,013 B2
(45) Date of Patent: Sep. 13, 2016

(54) SEMICONDUCTOR LIGHT EMITTING DEVICE AND METHOD FOR MANUFACTURING THE SAME

(71) Applicant: Kabushiki Kaisha Toshiba, Tokyo (JP)

(72) Inventors: Miyoko Shimada, Kanagawa (JP); Akihiro Kojima, Kanagawa (JP); Yosuke Akimoto, Kanagawa (JP); Hideto Furuyama, Kanagawa (JP); Hideyuki Tomizawa, Gunma (JP); Yoshiaki Sugizaki, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/778,005

(22) Filed: Feb. 26, 2013

(65) Prior Publication Data

US 2013/0248915 A1    Sep. 26, 2013

(30) Foreign Application Priority Data

Mar. 23, 2012   (JP) ................. 2012-067429
Sep. 14, 2012   (JP) ................. 2012-202760

(51) Int. Cl.
*H01L 33/38* (2010.01)
*H01L 33/00* (2010.01)
(Continued)

(52) U.S. Cl.
CPC ............. *H01L 33/38* (2013.01); *H01L 33/007* (2013.01); *H01L 33/46* (2013.01);
(Continued)

(58) Field of Classification Search
CPC ..... H01L 33/02; H01L 33/08; H01L 33/007; H01L 33/36; H01L 33/44; H01L 33/62; H01L 33/382; H01L 33/385; H01L 33/502; H01L 33/50; H01L 33/60; H01L 33/507; H01L 33/38; H01L 33/46; H01L 33/48; H01L 33/0079; H01L 33/486; H01L 33/505; H01L 2924/0002

USPC ..................................... 257/94–103
See application file for complete search history.

(56) References Cited

U.S. PATENT DOCUMENTS 6,373,188 B1 * 4/2002 Johnson et al. ............. 313/506
7,435,606 B2   10/2008 Lee et al.
(Continued)

FOREIGN PATENT DOCUMENTS

EP    2302708 A2    3/2011
EP    2393132 A2    12/2011
(Continued)

OTHER PUBLICATIONS

European Search Report dated Dec. 2, 2015, mailed in counterpart European Application No. 13156331.4, 13 pages.
(Continued)

*Primary Examiner* — Matthew W Such
*Assistant Examiner* — Stephen C Smith
(74) *Attorney, Agent, or Firm* — Patterson & Sheridan, LLP

(57) ABSTRACT

According to one embodiment, a semiconductor light emitting device includes a semiconductor layer, a p-side electrode, an n-side electrode, an insulating film, a p-side interconnection section, an n-side interconnection section, a phosphor layer, and a metal film. The semiconductor layer is formed on a substrate which is then removed. The p-side interconnection section is provided on the insulating film and electrically connected to the p-side electrode. The n-side interconnection section is provided on the insulating film and electrically connected to the n-side electrode. The phosphor layer is provided on the first surface and includes a step portion continued to the side surface of the semiconductor layer. The metal film is provided on the side surface of the semiconductor layer and a side surface of the step portion of the phosphor layer.

45 Claims, 27 Drawing Sheets

(51) Int. Cl.
*H01L 33/46* (2010.01)
*H01L 33/50* (2010.01)
*H01L 33/48* (2010.01)

(52) U.S. Cl.
CPC ........ *H01L 33/0079* (2013.01); *H01L 33/486* (2013.01); *H01L 33/505* (2013.01); *H01L 33/507* (2013.01); *H01L 2924/0002* (2013.01)

(56) References Cited

U.S. PATENT DOCUMENTS

| | | | | |
|---|---|---|---|---|
| 7,755,095 | B2 * | 7/2010 | Nagai | F21K 9/00 257/88 |
| 7,956,368 | B2 * | 6/2011 | Nagai et al. | 257/93 |
| 8,129,743 | B2 * | 3/2012 | Suehiro et al. | 257/100 |
| 8,350,285 | B2 * | 1/2013 | Sugizaki | H01L 33/0095 257/98 |
| 8,395,175 | B2 * | 3/2013 | Hsu | H01L 33/507 257/98 |
| 8,552,463 | B2 * | 10/2013 | Tischler | H01L 23/4985 257/99 |
| 2002/0070383 | A1 | 6/2002 | Shibata et al. | |
| 2007/0181895 | A1 * | 8/2007 | Nagai | H01L 33/0079 257/98 |
| 2008/0121923 | A1 * | 5/2008 | Harle | H01L 33/44 257/100 |
| 2009/0127575 | A1 | 5/2009 | Horng et al. | |
| 2009/0289272 | A1 * | 11/2009 | Kim | H01L 33/486 257/98 |
| 2010/0017922 | A1 * | 1/2010 | Shin et al. | 850/21 |
| 2010/0019254 | A1 * | 1/2010 | Nagai et al. | 257/88 |
| 2010/0051996 | A1 * | 3/2010 | Hsu | H01L 33/507 257/98 |
| 2010/0140640 | A1 * | 6/2010 | Shimokawa | H01L 33/0079 257/98 |
| 2010/0148198 | A1 * | 6/2010 | Sugizaki | H01L 33/44 257/98 |
| 2010/0213822 | A1 * | 8/2010 | Shimooka | C01B 21/068 313/503 |
| 2011/0012169 | A1 | 1/2011 | Takizawa et al. | |
| 2011/0073889 | A1 * | 3/2011 | Sugizaki | H01L 33/0095 257/98 |
| 2011/0210311 | A1 | 9/2011 | Kim et al. | |
| 2011/0284910 | A1 | 11/2011 | Iduka et al. | |
| 2011/0297987 | A1 * | 12/2011 | Koizumi | H01L 33/44 257/98 |
| 2012/0012869 | A1 | 1/2012 | Song | |
| 2012/0049219 | A1 | 3/2012 | Kamiya et al. | |
| 2012/0074441 | A1 * | 3/2012 | Seo | H01L 27/153 257/91 |
| 2012/0086044 | A1 | 4/2012 | Hata et al. | |
| 2012/0138988 | A1 * | 6/2012 | Lee | H01L 33/62 257/98 |
| 2012/0228627 | A1 | 9/2012 | Sazawa | |
| 2013/0092970 | A1 | 4/2013 | Sugizaki et al. | |
| 2013/0187174 | A1 * | 7/2013 | Tischler | H01L 33/50 257/80 |

FOREIGN PATENT DOCUMENTS

| | | |
|---|---|---|
| JP | 2003347589 A | 12/2003 |
| JP | 2004080050 A | 3/2004 |
| JP | 2010-157773 | 7/2010 |
| JP | 2011-071272 A | 4/2011 |
| TW | 2011033934 A | 10/2011 |

OTHER PUBLICATIONS

Japanese Office Action dated Jan. 28, 2016, filed in Japanese counterpart Application No. 2012-202760, 3 pages (with translation).

Taiwan Office Action dated Jul. 30, 2015, filed in Taiwan counterpart Application No. 101148082, 21 pages (with translation).

Japanese Office Action dated Jul. 7, 2015, filed in Japanese counterpart Application No. 2012-202760, 7 pages (with translation).

Taiwan Office Action dated Apr. 15, 2015, filed in Taiwan counterpart Application No. 101148082, 18 pages (with translation).

\* cited by examiner

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from Japanese Patent Application No. 2012-067429, filed on Mar. 23, 2012, and Japanese Patent Application No. 2012-202760, filed on Sep. 14, 2012; the entire contents of all of which are incorporated herein by reference.

FIELD

Embodiments described herein relate generally to a semiconductor light emitting device and a method for manufacturing the same.

BACKGROUND

There is known a method for manufacturing a semiconductor light emitting device in which a semiconductor layer including a light emitting layer, electrodes and the like are formed on a substrate, and then the semiconductor layer is separated into a plurality on the substrate (on the wafer level).

DETAILED DESCRIPTION

Figure 1:
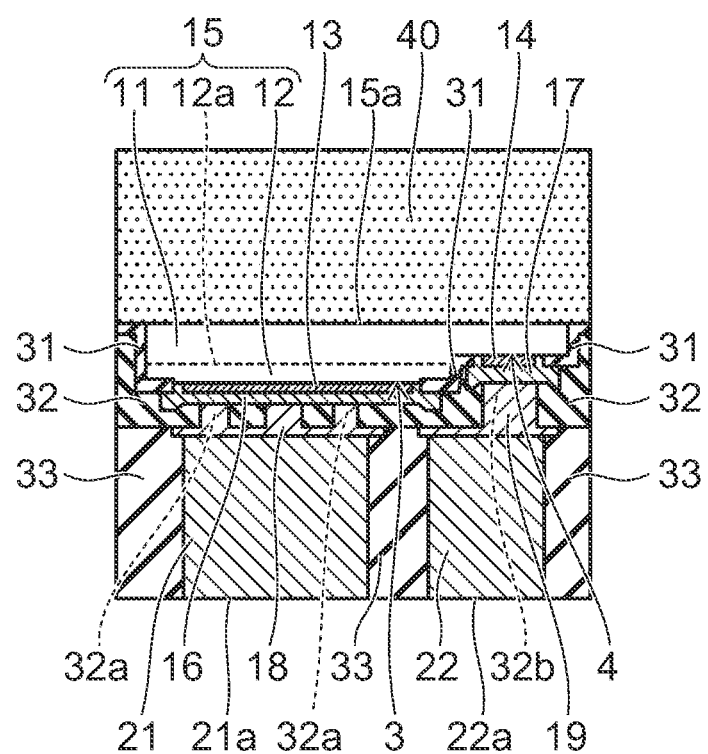
FIG. 1 is a schematic sectional view of a semiconductor light emitting device of a first embodiment.

According to one embodiment, a semiconductor light emitting device includes a semiconductor layer, a p-side electrode, an n-side electrode, an insulating film, a p-side interconnection section, an n-side interconnection section, a phosphor layer, and a metal film. The semiconductor layer is formed on a substrate which is then removed. The semiconductor layer includes a first surface, a second surface opposite to the first surface, a side surface continued to the first surface, and a light emitting layer. The p-side electrode is provided on the second surface in a region including the light emitting layer. The n-side electrode is provided on the second surface in a region not including the light emitting layer. The insulating film covers the p-side electrode and the n-side electrode. The p-side interconnection section is provided on the insulating film and electrically connected to the p-side electrode through a p-side via penetrating through the insulating film. The n-side interconnection section is provided on the insulating film and electrically connected to the n-side electrode through an n-side via penetrating through the insulating film. The phosphor layer is provided on the first surface and includes a step portion continued to the side surface of the semiconductor layer. The metal film is provided on the side surface of the semiconductor layer and a side surface of the step portion of the phosphor layer.

Embodiments will now be described with reference to the drawings. In the drawings, like elements are labeled with like reference numerals.

(First Embodiment)

FIG. 1 is a schematic sectional view of a semiconductor light emitting device of a first embodiment.

The semiconductor light emitting device of the first embodiment includes a semiconductor layer 15. The semiconductor layer 15 has a first surface 15a and a second surface formed on the opposite side therefrom. Light is emitted outside primarily from the first surface 15a (top surface in FIG. 1) of the semiconductor layer 15. A p-side electrode 13 and an n-side electrode 14 are provided on the second surface of the semiconductor layer 15.

The semiconductor layer 15 includes a first semiconductor layer 11 and a second semiconductor layer 12. The first semiconductor layer 11 and the second semiconductor layer 12 are made of e.g. a material containing gallium nitride. The first semiconductor layer 11 includes e.g. an n-type layer functioning as a lateral path of current. The second semiconductor layer 12 includes a p-type layer and a light emitting layer (active layer) 12a.

The second surface of the semiconductor layer 15 is processed into an uneven shape, and part of the light emitting layer 12a is removed. Thus, the second surface of the semiconductor layer 15 includes an emitting region 3 including the light emitting layer 12a (or opposed to the light emitting layer 12a), and a non-emitting region 4 not including the light emitting layer 12a (or not opposed to the light emitting layer 12a).

The p-side electrode 13 is provided on the emitting region 3 of the second surface. The n-side electrode 14 is provided on the non-emitting region 4 of the second surface. In the second surface, the area of the emitting region 3 is larger than the area of the non-emitting region 4. The area of the p-side electrode 13 extending on the second surface (emitting region 3) is larger than the area of the n-side electrode 14 extending on the second surface (non-emitting region 4).

An insulating film 31 is provided on the side surface of the semiconductor layer 15. The insulating film 31 is provided also on the portion of the second surface where the p-side electrode 13 and the n-side electrode 14 are not provided. Furthermore, the insulating film 31 is provided also on the step difference portion between the emitting region 3 and the non-emitting region 4. The insulating film 31 is an inorganic insulating film such as silicon oxide film and silicon nitride film.

The p-side electrode 13 is covered with a p-side pad 16. The n-side electrode 14 is covered with an n-side pad 17. The p-side pad 16 and the n-side pad 17 are made of metal material and function for electrode protection and as a reflection layer.

On the second surface side, a first insulating layer (hereinafter simply referred to as insulating layer) 32 is further provided. The insulating layer 32 covers the insulating film 31, part of the p-side pad 16, and part of the n-side pad 17. The insulating film 31 and the insulating layer 32 are not provided on the first surface 15a.

The side surface of the semiconductor layer 15 continued from the first surface 15a is covered with the insulating film 31 and the insulating layer 32. In conjunction with the resin layer 33 described later, the insulating layer 32 forms a side surface of the semiconductor light emitting device.

The insulating layer 32 is made of e.g. a resin such as polyimide having high patternability for fine openings. Alternatively, the insulating layer 32 can be made of inorganic material such as silicon oxide and silicon nitride.

In the insulating layer 32, a plurality of first openings 32a reaching the p-side pad 16 and a second opening 32b reaching the n-side pad 17 are formed.

On the insulating layer 32, a p-side interconnection layer 18 and an n-side interconnection layer 19 are provided and spaced from each other. The p-side interconnection layer 18 is provided also in the first opening 32a and electrically connected to the p-side pad 16 and the p-side electrode 13. The n-side interconnection layer 19 is provided also in the second opening 32b and electrically connected to the n-side pad 17 and the n-side electrode 14.

On the surface of the p-side interconnection layer 18 on the opposite side from the semiconductor layer 15, a p-side metal pillar 21 is provided. The p-side metal pillar 21 is thicker than the p-side interconnection layer 18. The p-side interconnection layer 18 and the p-side metal pillar 21 constitute a p-side interconnection section in the embodiment.

On the surface of the n-side interconnection layer 19 on the opposite side from the semiconductor layer 15, an n-side metal pillar 22 is provided. The n-side metal pillar 22 is thicker than the n-side interconnection layer 19. The n-side interconnection layer 19 and the n-side metal pillar 22 constitute an n-side interconnection section in the embodiment.

On the insulating layer 32, a resin layer 33 is provided as a second insulating layer. The resin layer 33 covers the periphery of the p-side interconnection section and the periphery of the n-side interconnection section.

The surface of the p-side interconnection layer 18 except the surface connected to the p-side metal pillar 21, and the surface of the n-side interconnection layer 19 except the surface connected to the n-side metal pillar 22, are covered with the resin layer 33. Furthermore, the resin layer 33 is provided between the p-side metal pillar 21 and the n-side metal pillar 22, and covers the side surface of the p-side metal pillar 21 and the side surface of the n-side metal pillar 22. The resin layer 33 is filled in between the p-side metal pillar 21 and the n-side metal pillar 22.

The surface of the p-side metal pillar 21 on the opposite side from the p-side interconnection layer 18 is not covered with the resin layer 33 but exposed, and functions as a p-side external terminal 21a to be bonded to a mounting substrate. The surface of the n-side metal pillar 22 on the opposite side from the n-side interconnection layer 19 is not covered with the resin layer 33 but exposed, and functions as an n-side external terminal 22a to be bonded to the mounting substrate.

Each thickness of the p-side interconnection section, the n-side interconnection section, and the resin layer 33 is thicker than the thickness of the semiconductor layer 15. Here, the aspect ratio (the ratio of thickness to planar size) of the p-side metal pillar 21 and the n-side metal pillar 22 is not limited to 1 or more, but may be less than 1.

The p-side metal pillar 21, the n-side metal pillar 22, and the resin layer 33 reinforcing them function as a support body for the semiconductor layer 15. Thus, even if the substrate used to form the semiconductor layer 15 is removed as described later, the support body including the p-side metal pillar 21, the n-side metal pillar 22, and the resin layer 33 can stably support the semiconductor layer 15 and increase the mechanical strength of the semiconductor light emitting device.

Furthermore, in the state of the semiconductor light emitting device mounted on the mounting substrate, the stress applied to the semiconductor layer 15 can be absorbed and relaxed by the p-side metal pillar 21 and the n-side metal pillar 22.

The p-side interconnection section including the p-side interconnection layer 18 and the p-side metal pillar 21 is connected to the p-side pad 16 through a plurality of vias provided in the plurality of first openings 32a and separated from each other. Thus, high stress relaxation effect is achieved by the p-side interconnection section.

Figure 9:
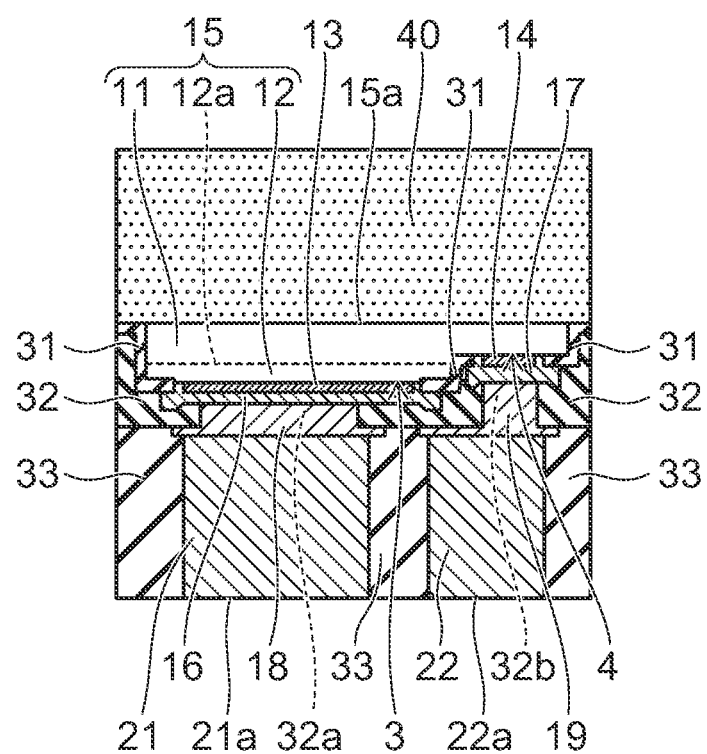

Alternatively, as shown in FIG. 9, the p-side interconnection layer 18 may be connected to the p-side pad 16 through one large first opening 32a. In this case, heat dissipation of the light emitting layer 12a can be improved through the p-side electrode 13, the p-side pad 16, the p-side interconnection layer 18, and the p-side metal pillar 21, all made of metal.

The material of the p-side interconnection layer 18, the n-side interconnection layer 19, the p-side metal pillar 21, and the n-side metal pillar 22 can be e.g. copper, gold, nickel, or silver. Among them, copper achieves good thermal conductivity, high migration resistance, and good adhesiveness to insulating material.

Preferably, the thermal expansion coefficient of the resin layer 33 is equal or close to that of the mounting substrate. Such a resin layer can be made of e.g. epoxy resin, silicone resin, or fluororesin.

The first semiconductor layer 11 is electrically connected to the n-side metal pillar 22 including the n-side external terminal 22a through the n-side electrode 14, the n-side pad 17, and the n-side interconnection layer 19. The second semiconductor layer 12 including the light emitting layer 12a is electrically connected to the p-side metal pillar 21 including the p-side external terminal 21a through the p-side electrode 13, the p-side pad 16, and the p-side interconnection layer 18.

Part of the n-side interconnection layer 19 overlaps the portion of the insulating layer 32 opposed to the light emitting layer 12a. The area of the n-side interconnection layer 19 extending on the insulating layer 32 is larger than the area of the n-side interconnection layer 19 connected to the n-side pad 17.

According to the embodiment, high optical output can be obtained by the light emitting layer 12a formed over a larger region than the n-side electrode 14. Furthermore, the embodiment can realize a structure in which the n-side electrode 14 provided on the non-emitting region 4 not including the light emitting layer 12a and being smaller than the emitting region 3 is rearranged on the mounting surface side as an n-side interconnection layer 19 having a larger area than the n-side electrode 14.

The area of the p-side interconnection layer 18 connected to the p-side pad 16 through the plurality of first openings 32a is larger than the area of the n-side interconnection layer 19 connected to the n-side pad 17 through the second opening 32b. This improves the distribution of current to the light emitting layer 12a, and can improve the dissipation of heat generated in the light emitting layer 12a.

On the first surface 15a of the semiconductor layer 15, a phosphor layer 40 is provided. The phosphor layer 40 includes phosphor particles capable of absorbing emission light (excitation light) from the light emitting layer 12a and emitting wavelength converted light. The phosphor particles are dispersed in a transparent resin transparent to the light from the light emitting layer 12a and the wavelength converted light of the phosphor particles. The semiconductor light emitting device of the embodiment can emit mixed light of the light from the light emitting layer 12a and the wavelength converted light of the phosphor particles.

For instance, the phosphor particle can be a yellow phosphor particle emitting yellow light. Then, for instance, white color or light bulb color can be obtained as a mixed color of blue light from the light emitting layer 12a made of GaN-based material and yellow light being the wavelength converted light of the phosphor layer 40.

The phosphor layer can be a red phosphor layer, yellow phosphor layer, green phosphor layer, or blue phosphor layer illustrated below.

The red phosphor layer can contain e.g. nitride-based phosphor CaAlSiN$_3$:Eu or SiAlON-based phosphor.

In particular, the SiAlON-based phosphor represented by the following composition formula (1) can be used.

$$(M_{1-x}R_x)_{a1}AlSi_{b1}O_{c1}N_{d1} \quad (1)$$

(M is at least one metallic element except Si and Al, and preferably at least one of Ca and Sr in particular. R is an emission center element, and preferably Eu in particular. x, a1, b1, c1, and d1 satisfy the following relations: 0<x≤1, 0.6<a1<0.95, 2<b1<3.9, 0.25<c1<0.45, and 4<d1<5.7.)

By using the SiAlON-based phosphor represented by composition formula (1), the temperature characteristics of the wavelength conversion efficiency are improved. Thus, the efficiency in the high current density region can be further improved.

The yellow phosphor layer can contain e.g. silicate-based phosphor (Sr,Ca,Ba)$_2$SiO$_4$:Eu.

The green phosphor layer can contain e.g. halophosphate-based phosphor (Ba,Ca,Mg)$_{10}$(PO$_4$)$_6$·Cl$_2$:Eu or SiAlON-based phosphor.

In particular, the SiAlON-based phosphor represented by the following composition formula (2) can be used.

$$(M_{1-x}R_x)_{a2}AlSi_{b2}O_{c2}N_{d2} \quad (2)$$

(M is at least one metallic element except Si and Al, and preferably at least one of Ca and Sr in particular. R is an emission center element, and preferably Eu in particular. x, a2, b2, c2, and d2 satisfy the following relations: 0<x≤1, 0.93<a2<1.3, 4.0<b2<5.8, 0.6<c2<1, and 6<d2<11.)

By using the SiAlON-based phosphor represented by composition formula (2), the temperature characteristics of the wavelength conversion efficiency are improved. Thus, the efficiency in the high current density region can be further improved.

The blue phosphor layer can contain e.g. oxide-based phosphor BaMgAl$_{10}$O$_{17}$:Eu.

Figure 25:
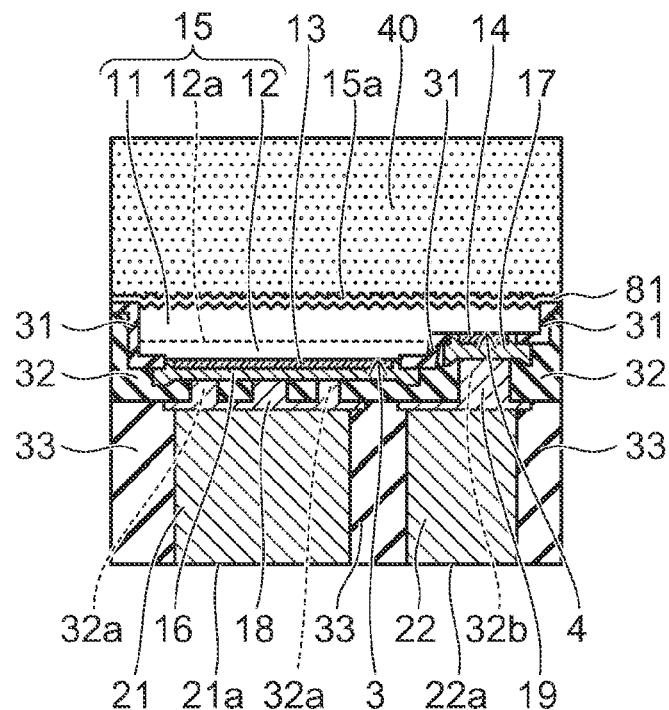
FIG. 25 is a schematic sectional view of a structure in which an adhesion layer 81 is provided in the semiconductor light emitting device of FIG. 1.

Furthermore, as shown in FIG. 25, on the first surface 15a of the semiconductor layer 15, fine unevenness may be formed to improve the light extraction efficiency. An adhesion layer 81 is provided between the first surface 15a and the phosphor layer 40. The adhesion layer 81 is formed conformally along the unevenness of the first surface 15a. The adhesion layer 81 is thinner than the phosphor layer 40. The adhesion layer 81 is transparent to the emission light of the light emitting layer 12a.

Figure 26:
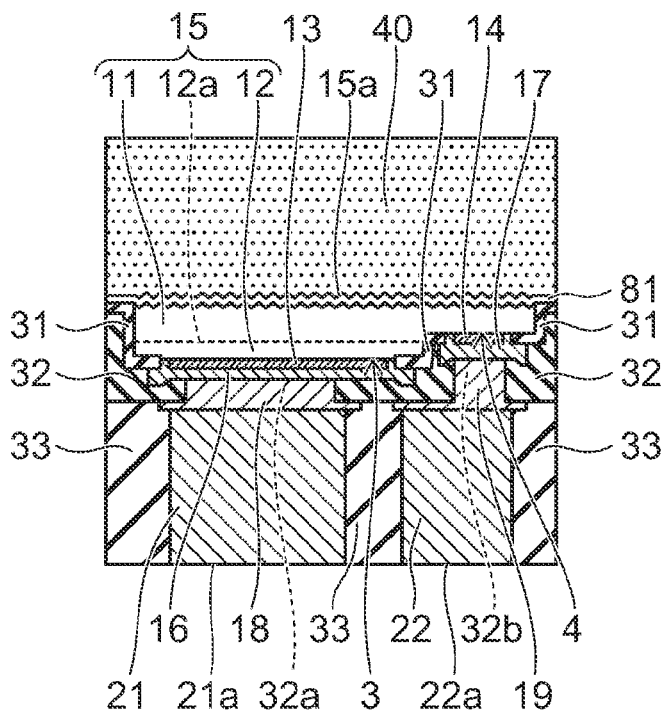
FIG. 26 is a schematic sectional view of a structure in which an adhesion layer 81 is provided in the semiconductor light emitting device of FIG. 9.

Also in the structure shown in FIG. 9 described above, as shown in FIG. 26, an adhesion layer 81 may be provided between the first surface 15a of the semiconductor layer 15 and the phosphor layer 40.

The adhesion layer 81 includes e.g. at least one of silicon oxide film (SiO$_2$ film), silicon nitride film (SiN film), glass film formed by the spin coating method (SOG (spin on glass) film), silicon oxynitride film (SiON film), silicon carbide film (SiC film), and carbon-containing silicon oxide film (SiOC film).

The adhesion layer 81 has higher adhesive force to the phosphor layer 40 than the semiconductor layer 15. That is, the force required to peel the phosphor layer 40 bonded to the adhesion layer 81 from the adhesion layer 81 is larger than the force required to peel the phosphor layer 40 bonded to the semiconductor layer 15 from the semiconductor layer 15. Because the adhesion layer 81 has higher adhesive force to the phosphor layer 40 than the semiconductor layer 15, peeling of the phosphor layer 40 from the semiconductor layer 15 is prevented. Thus, the reliability can be improved.

Next, with reference to FIGS. 2A to 7B, a method for manufacturing a semiconductor light emitting device of the first embodiment is described.

Figure 2A:
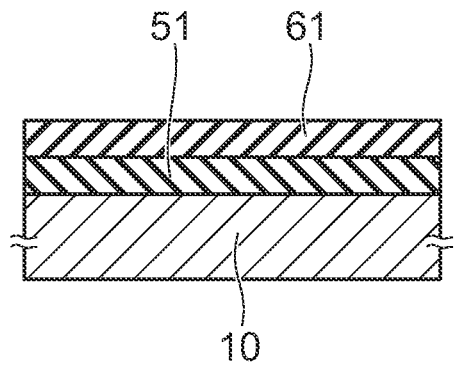
FIGS. 2A to 6C are schematic sectional views showing a method for manufacturing of the semiconductor light emitting device of the first embodiment.

FIG. 2A shows a cross section of a wafer in which a sacrificial layer 51 and a resist film 61 are formed on the major surface of a substrate 10. For instance, the substrate 10 is a silicon substrate. The sacrificial layer 51 is a silicon oxide film. Alternatively, the sacrificial layer 51 may be a silicon nitride film.

Figure 2B:
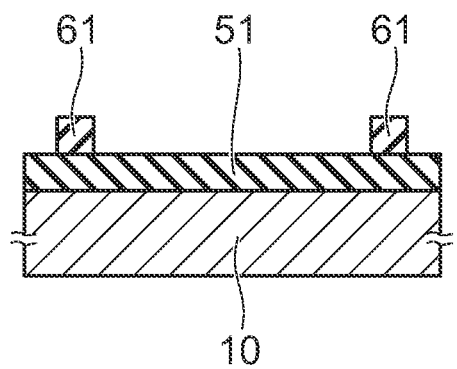
Figure 2C:
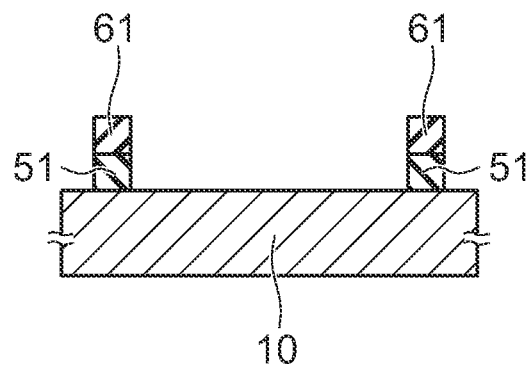

Light exposure and development are performed on the resist film 61. Thus, as shown in FIG. 2B, the resist film 61 is patterned. Using the resist film 61 as a mask, the sacrificial layer 51 is processed as shown in FIG. 2C. The sacrificial layer 51 is etched by e.g. the RIE (reactive ion etching) method. After the sacrificial layer 51 is processed, the resist film 61 is removed as shown in FIG. 2D.

Figure 2D:
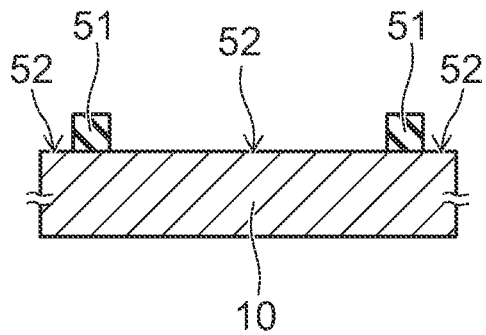
Figure 7A:
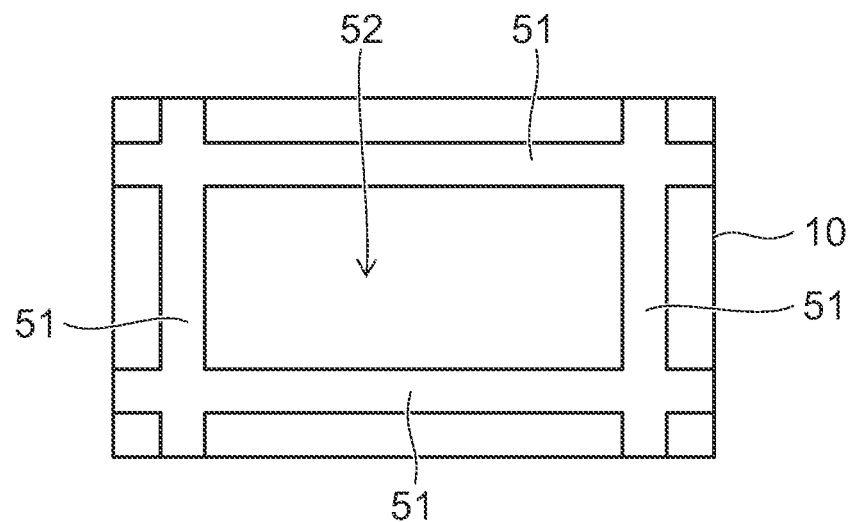
FIGS. 7A and 7B are schematic plan views showing the method for manufacturing of the semiconductor light emitting device of the first embodiment.

Here, FIG. 7A corresponds to the top view of FIG. 2D.

The sacrificial layer 51 is formed in e.g. a lattice planar pattern on the wafer surface. The sacrificial layer 51 is

formed in e.g. a planar pattern continuously surrounding the device region 52 of the substrate 10 where the sacrificial layer 51 is not formed. For instance, FIG. 7A shows a device region 52 having a rectangular planar shape. However, the planar shape of the device region 52 is not limited to being rectangular.

Figure 3A:
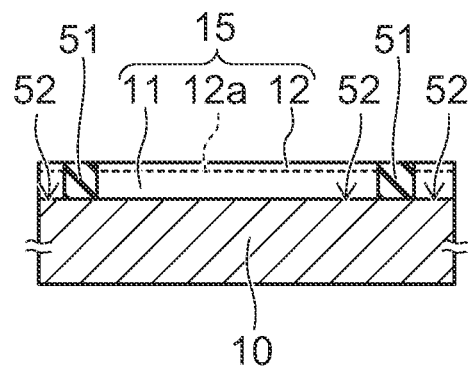

The sacrificial layer 51 is formed in e.g. a lattice shape on the substrate 10. On the device region 52 of the substrate 10 where the sacrificial layer 51 is not formed, a semiconductor layer 15 is formed as shown in FIG. 3A.

For instance, a semiconductor layer 15 made of gallium nitride-based material is epitaxially grown on the substrate 10 by the MOCVD (metal organic chemical vapor deposition) method. The semiconductor layer 15 is epitaxially grown only on the surface of the device region 52 where the surface of the substrate 10 is not covered with the sacrificial layer 51 but exposed.

The sacrificial layer 51 being a silicon oxide film or silicon nitride film can withstand the temperature during the step of epitaxially growing the semiconductor layer 15.

If the sacrificial layer 51 is an organic film, the sacrificial layer 51 may be decomposed and eliminated during the step of epitaxially growing the semiconductor layer 15. Furthermore, the decomposition product of the organic film may hamper the epitaxial growth of the semiconductor layer 15 or cause dust.

A first semiconductor layer 11 is formed on the major surface of the substrate 10. A second semiconductor layer 12 is formed on the first semiconductor layer 11. The first semiconductor layer 11 includes e.g. an underlying buffer layer and an n-type GaN layer. The second semiconductor layer 12 includes e.g. a light emitting layer 12a and a p-type GaN layer. The light emitting layer 12a can be a layer emitting e.g. blue, violet, blue-violet, near ultraviolet, or ultraviolet light.

The film thickness of the semiconductor layer 15 is controlled so as to be equal to the height of the sacrificial layer 51 or smaller than the height of the sacrificial layer 51. The semiconductor layer 15 is not overgrown on the sacrificial layer 51.

Figure 3B:
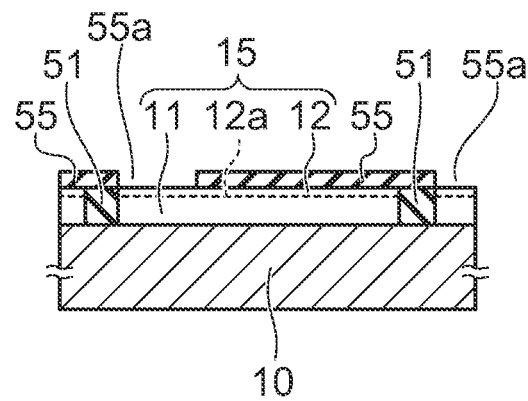

The top surface of the semiconductor layer 15 and the top surface of the sacrificial layer 51 are made nearly flush with each other. On these top surfaces, a mask layer 55 shown in FIG. 3B is formed. In the mask layer 55, an opening 55a is selectively formed. The mask layer 55 is made of the same material as the sacrificial layer 51, e.g., silicon oxide film or silicon nitride film.

Figure 3C:
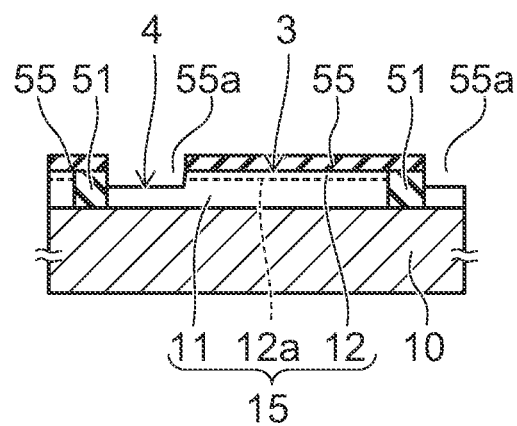

Then, for instance, by the RIE method using the mask layer 55, a partial region on the front surface side of the semiconductor layer 15 exposed in the opening 55a is selectively removed. In the portion below the opening 55a, the light emitting layer 12a is removed. Thus, as shown in FIG. 3C, a non-emitting region 4 not including the light emitting layer 12a is formed on the front surface side of the semiconductor layer 15.

Next, the sacrificial layer 51 and the mask layer 55 made of the same material as the sacrificial layer 51 are simultaneously removed. The sacrificial layer 51 and the mask layer 55 are removed by e.g. wet etching or dry etching.

The sacrificial layer 51 being a silicon oxide film or silicon nitride film can be easily removed with a high selection ratio with respect to the semiconductor layer 15 made of gallium nitride-based material.

Figure 3D:
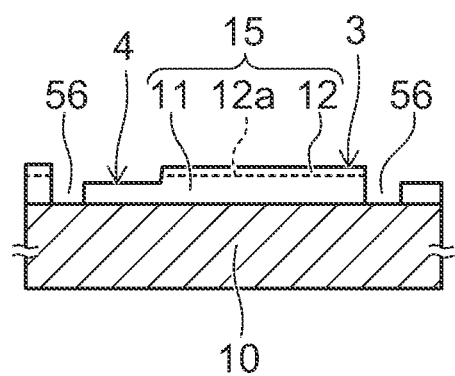

By the removal of the sacrificial layer 51, as shown in FIG. 3D, a trench 56 reaching the substrate 10 is formed. This trench 56 separates the semiconductor layer 15 into a plurality on the substrate 10. That is, simultaneously with the removal of the sacrificial layer 51, a structure with the semiconductor layer 15 device-separated into a plurality is obtained.

Figure 7B:
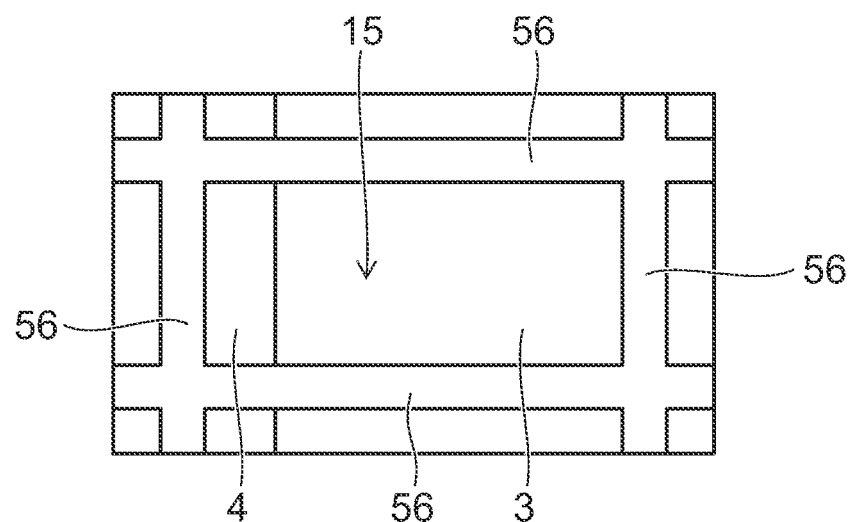

Here, FIG. 7B corresponds to the top view of FIG. 3D.

The trench 56 has the same planar pattern as the sacrificial layer 51. That is, the trench 56 is formed in e.g. a lattice planar pattern on the wafer surface. The trench 56 is formed in a planar pattern continuously surrounding the semiconductor layer 15.

As shown in FIG. 7B, for each semiconductor layer 15 surrounded with the trench 56, the emitting region 3 is larger than the non-emitting region 4.

Figure 4A:
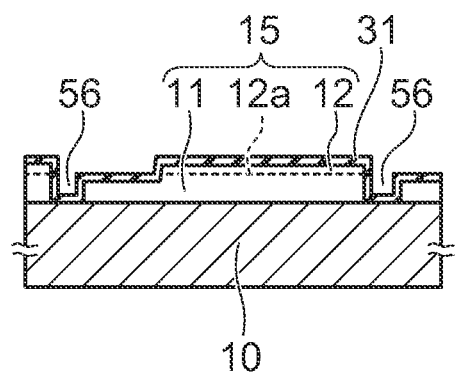

Next, as shown in FIG. 4A, the exposed portion of the substrate 10 is covered with an insulating film 31. That is, the insulating film 31 is formed on the inner wall (sidewall and bottom) of the trench 56, and the top surface (second surface) of the semiconductor layer 15 in FIG. 4A.

Figure 4B:
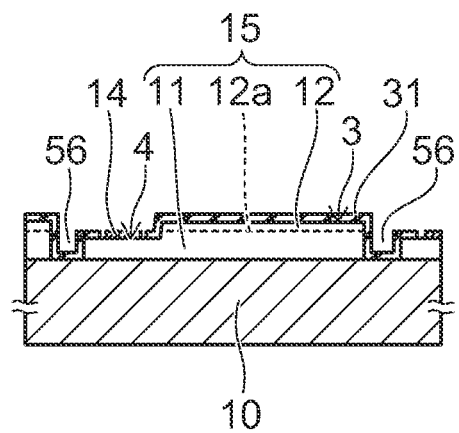
Figure 4C:
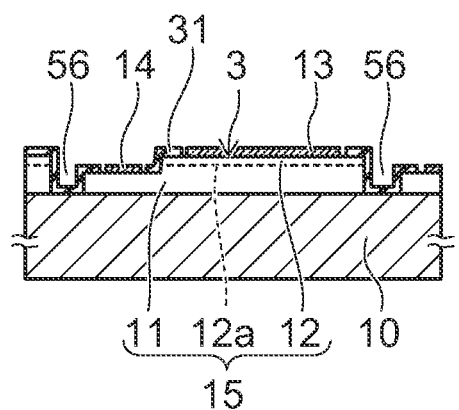

Next, part of the insulating film 31 on the non-emitting region 4 is removed to expose part of the non-emitting region 4. On the exposed non-emitting region 4, an n-side electrode 14 is formed as shown in FIG. 4B. Furthermore, part of the insulating film 31 on the emitting region 3 is removed to expose part of the emitting region 3. On the exposed emitting region 3, a p-side electrode 13 is formed as shown in FIG. 4C.

The n-side electrode 14 and the p-side electrode 13 are formed by e.g. the sputtering method or evaporation method. Either the n-side electrode 14 or the p-side electrode 13 may be formed first. The n-side electrode 14 and the p-side electrode 13 may be simultaneously formed from the same material.

Figure 4D:
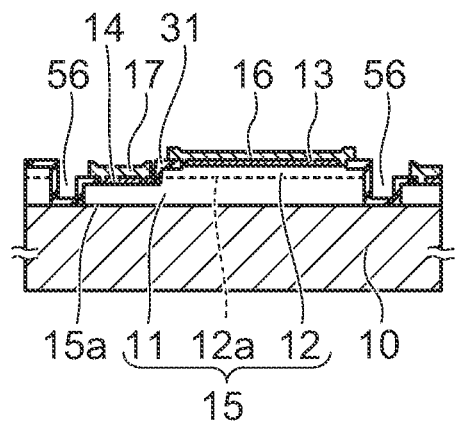

Next, as shown in FIG. 4D, a p-side pad 16 is formed on the p-side electrode 13, and an n-side pad 17 is formed on the n-side electrode 14. The area of the top surface of the p-side pad 16 is larger than the contact area between the p-side electrode 13 and the semiconductor layer 15. The area of the top surface of the n-side pad 17 is larger than the contact area between the n-side electrode 14 and the semiconductor layer 15.

Figure 5A:
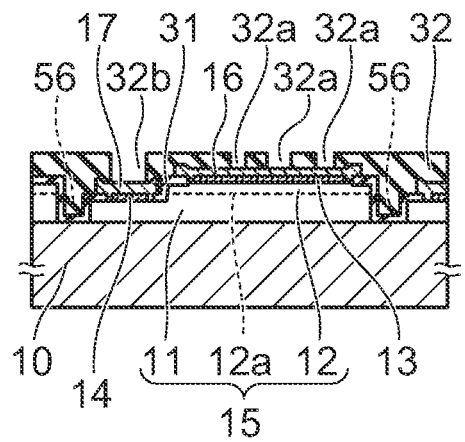

Next, all the exposed portions of the structure body on the substrate 10 obtained by the steps up to FIG. 4D are covered with an insulating layer 32 shown in FIG. 5A. Then, by etching using a resist mask, not shown, a first opening 32a and a second opening 32b are formed in the insulating layer 32. The first opening 32a reaches the p-side pad 16. The second opening 32b reaches the n-side pad 17. The trench 56 is filled with the insulating layer 32.

Next, a metal film, not shown, functioning as a plating seed metal is formed on the top surface of the insulating layer 32, the inner wall (sidewall and bottom) of the first opening 32a, and the inner wall (sidewall and bottom) of the second opening 32b. Then, a resist, not shown, is selectively formed on the metal film. Thus, Cu electrolytic plating is performed using the metal film as a current path.

Figure 5B:
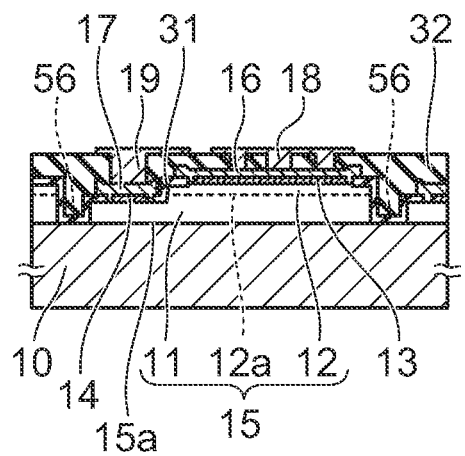

By this plating, as shown in FIG. 5B, a p-side interconnection layer 18 and an n-side interconnection layer 19 are formed on the insulating layer 32. The p-side interconnection layer 18 and the n-side interconnection layer 19 are made of e.g. copper material simultaneously formed by the plating method.

The p-side interconnection layer 18 is formed also in the first opening 32a, and electrically connected to the p-side pad 16 through the metal film being a seed metal. The n-side interconnection layer 19 is formed also in the second opening 32b, and electrically connected to the n-side pad 17 through the metal film being a seed metal.

Figure 5C:
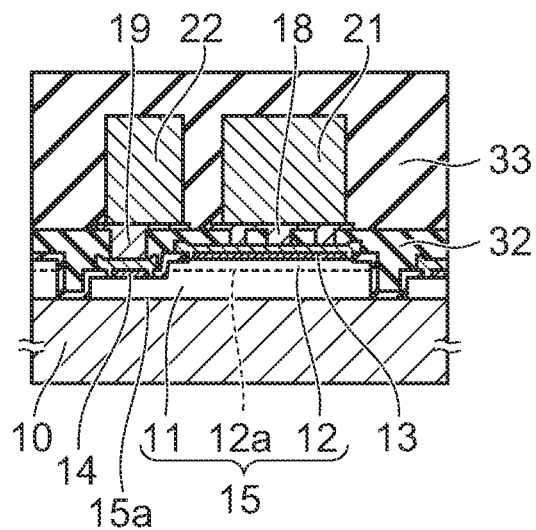

Next, a resist, not shown, is used as a mask to perform Cu electrolytic plating using the remaining metal film as a current path. By this plating, as shown in FIG. 5C, a p-side metal pillar 21 and an n-side metal pillar 22 are formed. The p-side metal pillar 21 is formed on the p-side interconnection layer 18. The n-side metal pillar 22 is formed on the n-side interconnection layer 19.

After the p-side metal pillar 21 and the n-side metal pillar 22 are formed, the exposed portion of the metal film used as the seed metal is removed. Thus, the metal film connected between the p-side interconnection layer 18 and the n-side interconnection layer 19 is divided.

Next, as shown in FIG. 5C, a resin layer 33 is formed on the insulating layer 32, around the p-side metal pillar 21, and around the n-side metal pillar 22.

Then, in the state in which the semiconductor layer 15 is supported by a support body including the p-side metal pillar 21, the n-side metal pillar 22, and the resin layer 33, the substrate 10 is removed. The substrate 10 is e.g. a silicon substrate, and can be easily removed by wet etching or dry etching.

Figure 6A:
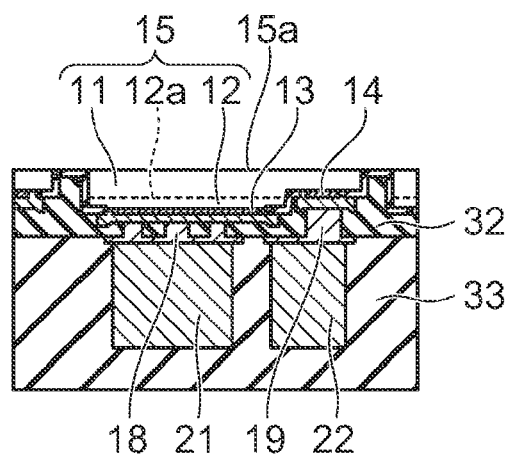

FIG. 6A shows the state after the removal of the substrate 10. The semiconductor layer 15 is supported by the support body (p-side metal pillar 21, n-side metal pillar 22, and resin layer 33) thicker than the semiconductor layer 15. Thus, even if the substrate 10 is eliminated, the wafer state can be maintained.

The resin constituting the resin layer 33, and the metal constituting the p-side metal pillar 21 and the n-side metal pillar 22 are softer materials than the semiconductor layer 15 made of GaN-based material. This can avoid damage to the semiconductor layer 15 even if the large internal stress produced by epitaxial growth for forming the semiconductor layer 15 on the substrate 10 is released at once when the substrate 10 is removed.

After the substrate 10 is removed, the first surface 15a is cleaned. Furthermore, as necessary, frost treatment for forming unevenness is performed. By forming fine unevenness at the first surface 15a, the light extraction efficiency can be increased.

Figure 6B:
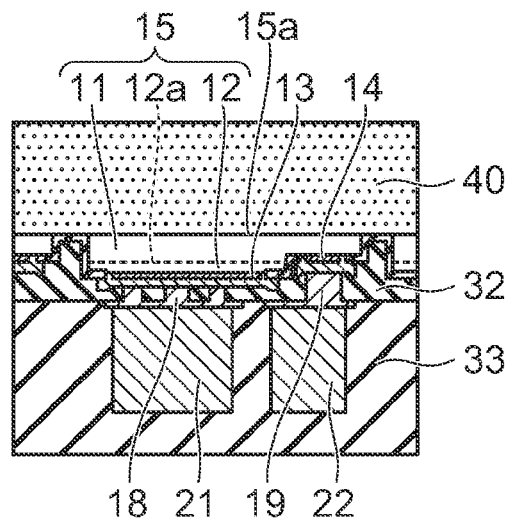

Then, as shown in FIG. 6B, on the first surface 15a, a phosphor layer 40 is formed. The step of forming the phosphor layer 40 includes the step of supplying a liquid transparent resin dispersed with phosphor particles onto the first surface 15a by such a method as printing, potting, molding, and compression molding, and the step of heat curing the resin.

Figure 6C:
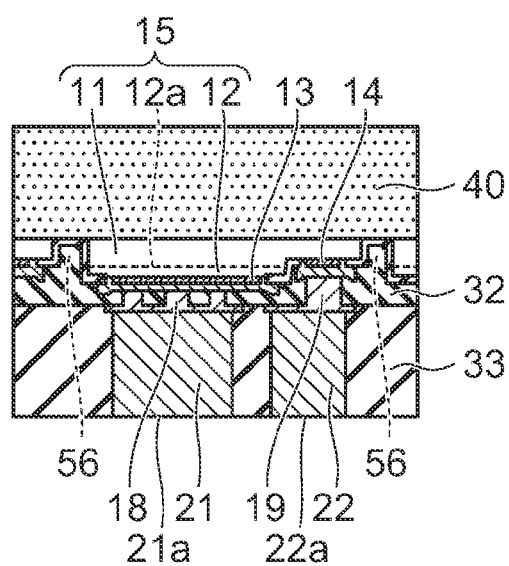

The resin layer 33 is ground. Thus, as shown in FIG. 6C, a p-side external terminal 21a and an n-side external terminal 22a are exposed from the resin layer 33.

Then, the phosphor layer 40, the insulating layer 32, and the resin layer 33 are cut at the position of the trench 56 and singulated into a plurality of semiconductor light emitting devices.

In the trench 56, the semiconductor layer 15 is not formed, but the trench 56 is filled with the insulating layer 32 made of resin. Furthermore, below the trench 56, the resin layer 33 is provided. Thus, in the dicing region, the semiconductor layer 15 is not provided, but a resin softer than the semiconductor layer 15 is provided. This can avoid damage to the semiconductor layer 15 at the time of dicing.

The above steps before dicing are performed collectively in the wafer state. Thus, after dicing, there is no need to form a support body and to protect the chip with insulating material for each semiconductor light emitting device. This can significantly reduce the production cost. In the singulated state shown in FIG. 1, the side surface of the semiconductor layer 15 has already been covered and protected with the insulating film 31 and the insulating layer 32.

According to the embodiment described above, on the portion of the substrate 10 constituting a device separation region, a sacrificial layer 51 is previously formed. In this state, a semiconductor layer 15 is formed on the substrate 10. That is, on the substrate 10, the semiconductor layer 15 is formed in the state of being already device-separated into a plurality by the sacrificial layer 51. This eliminates the need to separate the semiconductor layer 15 after forming the electrodes 13, 14, pads 16, 17 and the like. Thus, the device separation process can be simplified.

The substrate 10 may be a sapphire substrate. The sapphire substrate can be removed by e.g. the laser lift-off method.

That is, laser light is applied from the rear surface side of the sapphire substrate toward the first semiconductor layer 11. The laser light can be transmitted through the sapphire substrate, and has a wavelength in the absorption region of the first semiconductor layer 11.

When the laser light reaches the interface between the sapphire substrate and the first semiconductor layer 11, the first semiconductor layer 11 near the interface is decomposed by absorbing the energy of the laser light. For instance, the first semiconductor layer 11 made of GaN-based material is decomposed into gallium (Ga) and nitrogen gas. By this decomposition reaction, a small gap is formed between the sapphire substrate and the first semiconductor layer 11. Thus, the sapphire substrate and the first semiconductor layer 11 are separated. The laser light irradiation is performed a plurality of times throughout the wafer, once for each predefined region. Thus, the sapphire substrate is removed.

Also in the case of using a sapphire substrate, the sacrificial layer 51 can be made of silicon oxide film. Alternatively, the sacrificial layer 51 may be made of e.g. silicon nitride film. Here, the sacrificial layer 51 made of silicon oxide film can be removed more easily than the sacrificial layer 51 made of silicon nitride film.

In the case where the semiconductor layer 15 is e.g. a nitride semiconductor layer, the sapphire substrate is transmissive to the light emitted from the semiconductor layer 15. Thus, the sapphire substrate may be left on the first surface 15a without being removed.

Figure 8A:
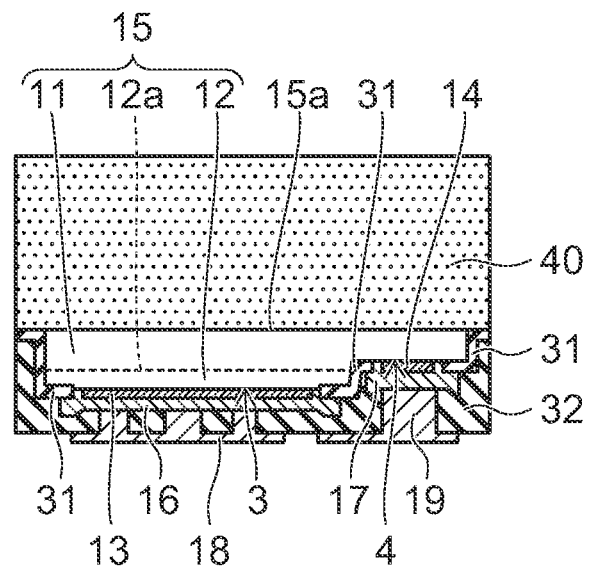
FIGS. 8A, 8B and 9 are schematic sectional views of another example of the semiconductor light emitting device of the first embodiment.

Alternatively, in the state of FIG. 5B, the substrate 10 may be removed. Then, the phosphor layer 40 may be formed on the first surface 15a. Subsequently, at the position of the trench 56, the phosphor layer 40 and the insulating layer 32 may be cut for singulation. FIG. 8A shows a schematic sectional view of this singulated semiconductor light emitting device. In the case of this structure, the p-side interconnection layer 18 and the n-side interconnection layer 19 function as external terminals.

Figure 8B:
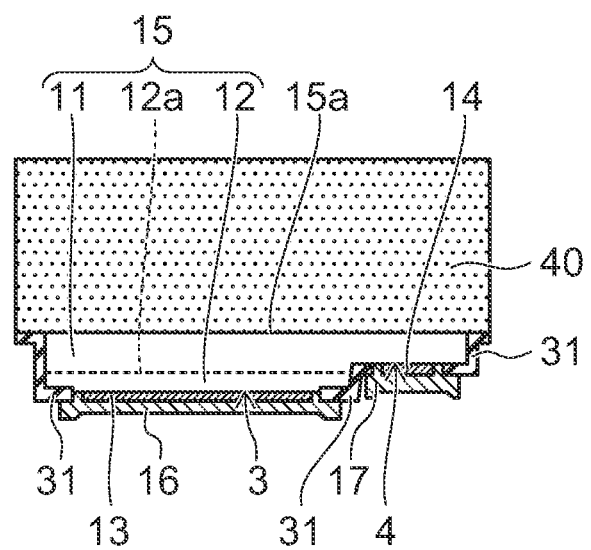

Alternatively, in the state of FIG. 4D, the substrate 10 may be removed. Then, the phosphor layer 40 may be formed on the first surface 15a. Subsequently, at the position of the trench 56, the phosphor layer 40 may be cut for singulation. FIG. 8B shows a schematic sectional view of this singulated semiconductor light emitting device. In the case of this structure, the p-side pad 16 and the n-side pad 17 function as external terminals.

The phosphor layer 40 does not necessarily need to be provided. Alternatively, a lens layer may be provided on the first surface 15a.

After the step of FIG. 6A for removing the substrate 10, an insulating film may be formed entirely on the exposed portion. Then, the phosphor layer 40 may be formed. The insulating film is formed by e.g. the sputtering method or plasma enhanced chemical vapor deposition method. The insulating film is a silicon oxide film or silicon nitride film having a film thickness not decreasing the light extraction efficiency. This prevents the refractive index of the medium from significantly changing in the direction of light extraction through the first surface 15a. Thus, the light extraction efficiency can be increased. Furthermore, this can improve the adhesiveness between the phosphor layer 40 and the first surface 15a.

An aspect of the embodiment includes forming a p-side metal pillar on the p-side interconnection layer, and forming an n-side metal pillar on the n-side interconnection layer.

An aspect of the embodiment includes forming a second insulating layer on the side surface of the p-side metal pillar and the side surface of the n-side metal pillar.

An aspect of the embodiment includes removing the substrate after forming the p-side metal pillar and the n-side metal pillar.

An aspect of the embodiment includes removing the substrate after forming the second insulating layer.

An aspect of the embodiment includes forming a phosphor layer on the surface of the semiconductor layer exposed by the removal of the substrate.

An aspect of the embodiment includes cutting the phosphor layer and the first insulating layer at the position of the trench after forming the phosphor layer.

An aspect of the embodiment includes forming a phosphor layer on the surface of the semiconductor layer exposed by the removal of the substrate.

An aspect of the embodiment includes cutting the phosphor layer, the first insulating layer, and the second insulating layer at the position of the trench after forming the phosphor layer.

An aspect of the embodiment includes cutting the first insulating layer at the position of the trench after removing the substrate.

An aspect of the embodiment includes cutting the first insulating layer and the second insulating layer at the position of the trench after removing the substrate.

Figure 10A:
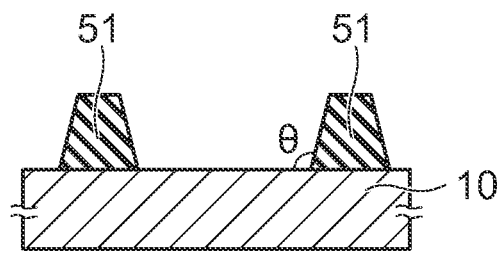
FIGS. 10A to 10D are schematic sectional views showing a method for manufacturing of a semiconductor light emitting device of a comparative example.
Figure 10B:
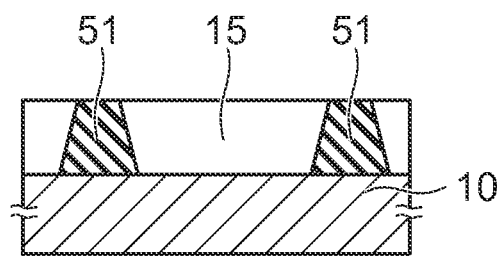

The aforementioned sacrificial layer 51 may have a cross section formed in a trapezoidal shape as shown in FIG. 10A. If the semiconductor layer 15 is grown on the substrate 10 using this trapezoidal sacrificial layer 51 as a mask, then as shown in FIG. 10B, the semiconductor layer 15 separated by the sacrificial layer 51 is formed in an inverse trapezoidal cross-sectional shape. That is, the side surface of the semiconductor layer 15 is formed in a tapered shape so that the substrate 10 makes an acute angle with the side surface of the semiconductor layer 15.

Figure 10C:
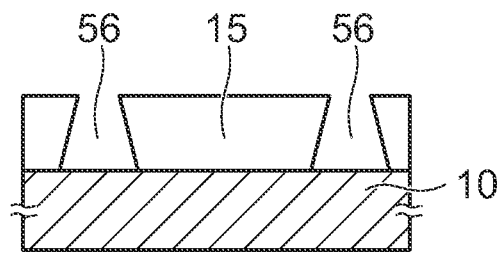

Then, as shown in FIG. 10C, if the sacrificial layer 51 is removed, trenches 56 separating the semiconductor layer 15 into a plurality on the substrate 10 are formed. The trench 56 is formed in a trapezoidal cross-sectional shape in which the opening is narrower than the bottom width.

Figure 10D:
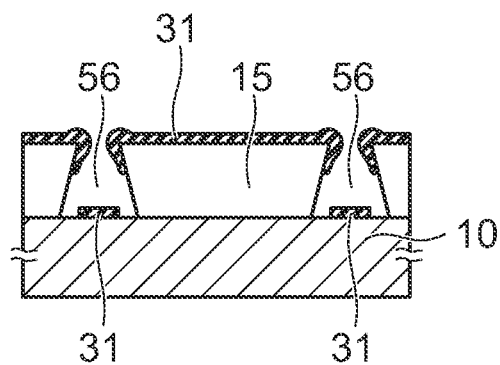

In such a trench 56 with the opening narrower than the bottom width, an insulating film 31 is formed by the step shown in FIG. 4A described above. Then, the insulating film 31 may fail to be formed conformally along the inner wall (side surface and bottom surface) of the trench 56. That is, as shown in FIG. 10D, the insulating film 31 may fail to be formed somewhere on the inner wall of the trench 56, or the film thickness of the insulating film 31 may be made nonuniform.

Thus, in view of preventing the opening of the trench 56 from becoming too narrow with respect to the bottom width, the angle between the substrate 10 and the side surface of the sacrificial layer 51 ($\theta$ in FIG. 10A) is preferably 100° or less. Furthermore, the sacrificial layer 51 is difficult to process so that the cross section of the sacrificial layer 51 has an inverted trapezoidal shape. Thus, a suitable range of the angle $\theta$ between the substrate 10 and the side surface of the sacrificial layer 51 can be given by 80° or more and 100° or less.

(Second Embodiment)

Next, with reference to FIGS. 11 to 23, a semiconductor light emitting device of a second embodiment is described.

The semiconductor light emitting device of the second embodiment is different from the semiconductor light emitting device of the first embodiment in such points as follows. A step portion 65 continued to the side surface 15c of the semiconductor layer 15 is formed on the phosphor layer 40. Metal films 42, 41 are formed on the side surface 15c of the semiconductor layer 15 and the side surface 66 of the step portion 65 of the phosphor layer 40. An inorganic insulating film 36 is formed between the side surface 15c of the semiconductor layer 15 and the metal film 42.

Figure 11:
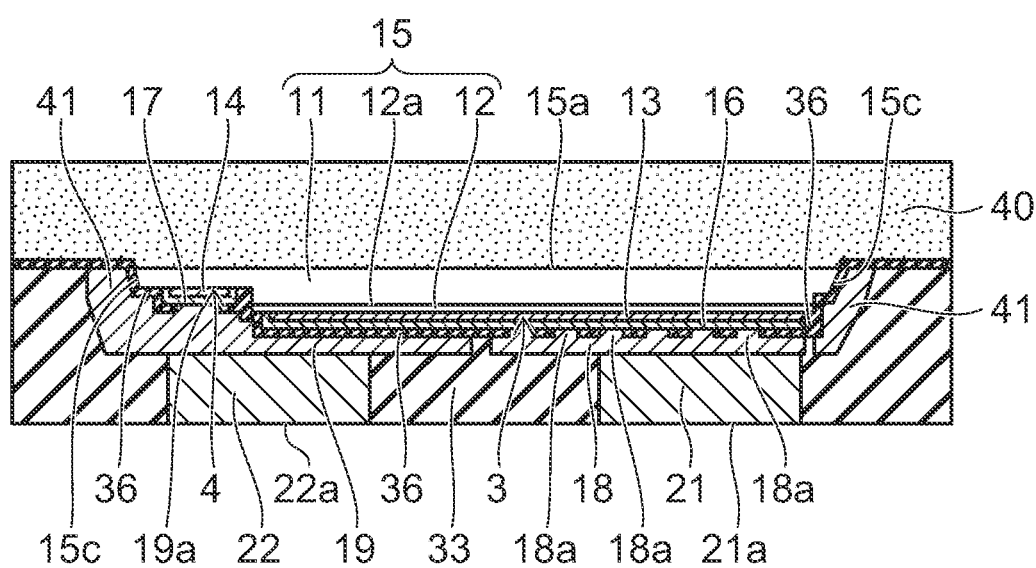
FIG. 11 is a schematic sectional view of a semiconductor light emitting device of a second embodiment.

FIG. 11 is a schematic sectional view of the semiconductor light emitting device of the second embodiment.

Figure 12A:
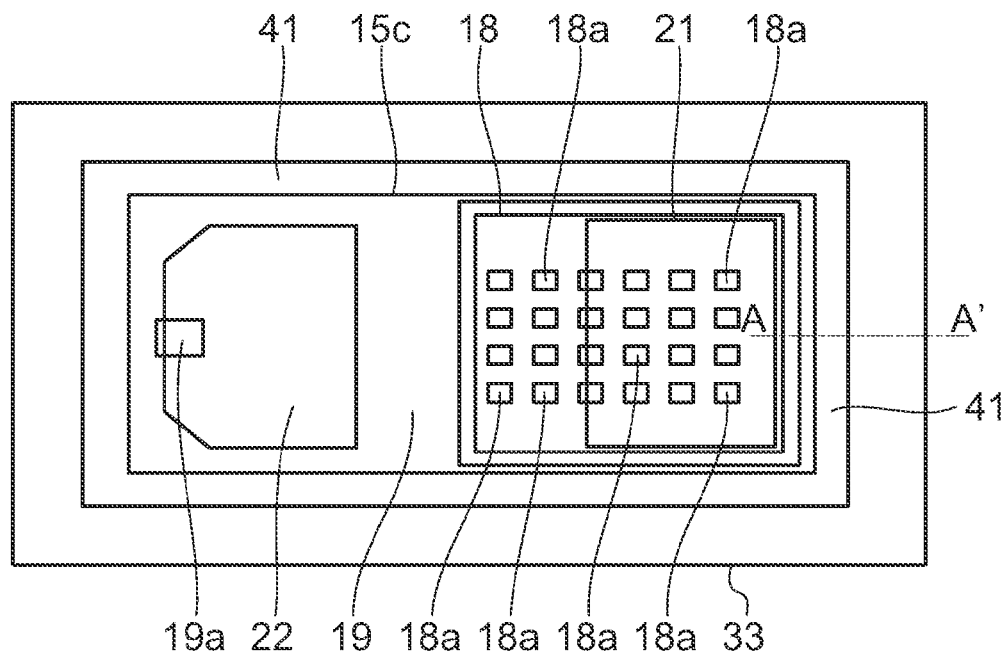
FIGS. 12A and 12B are schematic plan views of the semiconductor light emitting device of the second embodiment.
Figure 12B:
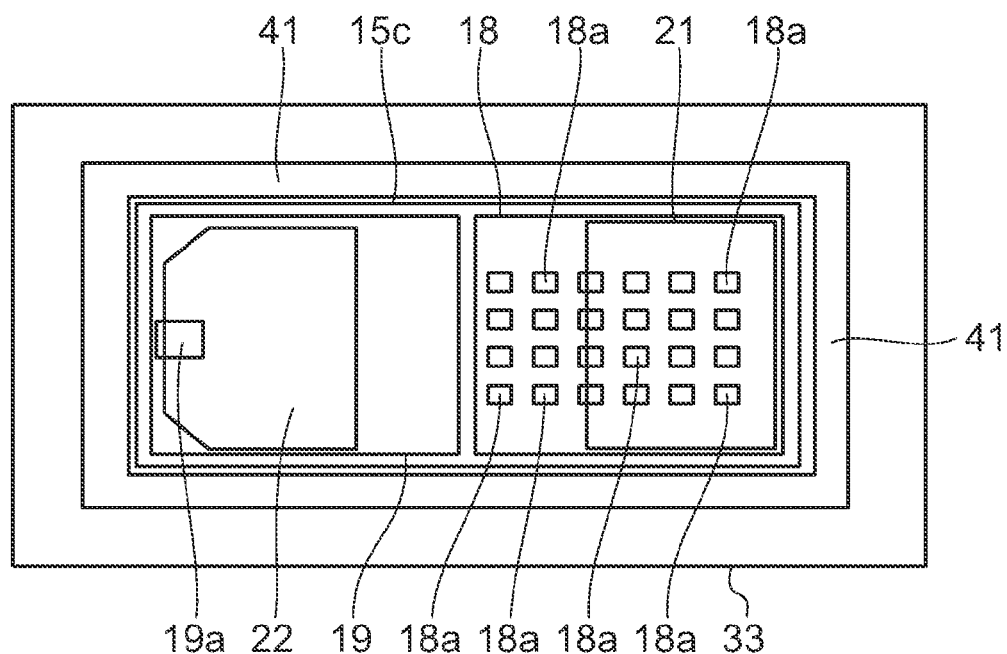

FIGS. 12A and 12B are schematic plan views of the semiconductor light emitting device of the second embodiment.

Figure 13:
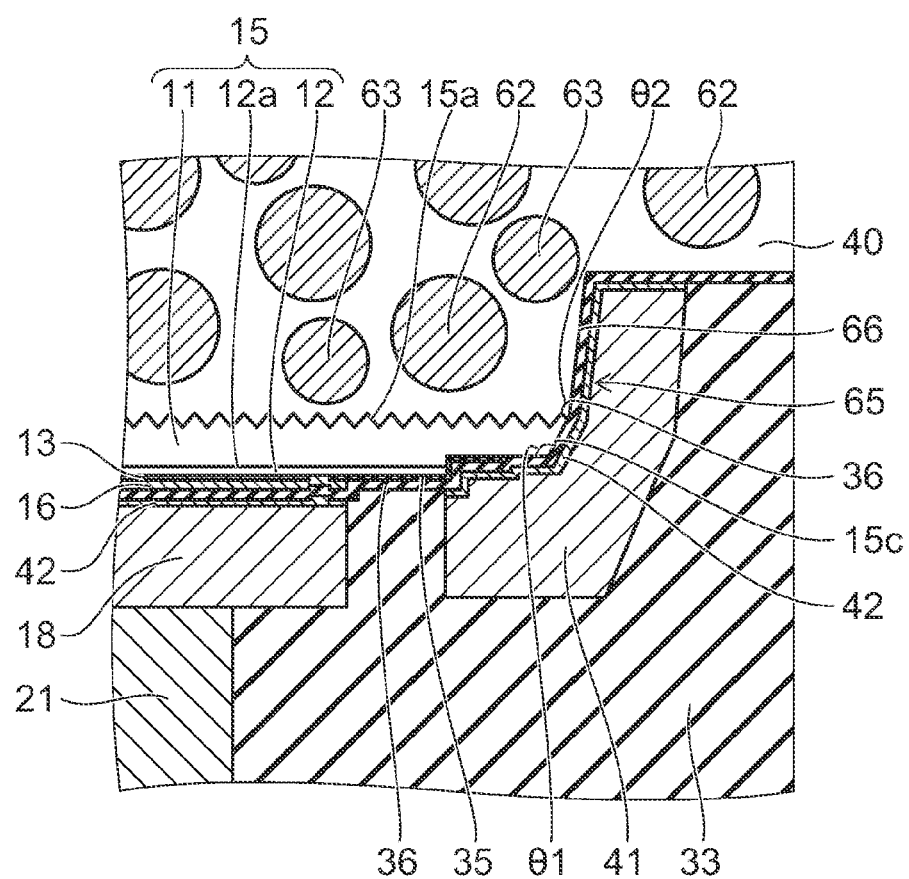
FIG. 13 is an enlarged sectional view taken along line A-A' in FIG. 12A.

FIG. 13 is an enlarged sectional view taken along line A-A' in FIG. 12A.

The same elements as those of the semiconductor light emitting device of the first embodiment described above are labeled with like reference numerals, and the detailed description thereof may be omitted.

As in the first embodiment, the semiconductor light emitting device of the second embodiment also includes a semiconductor layer 15 containing e.g. gallium nitride. The semiconductor layer 15 has a first surface 15a, a second surface formed on the opposite side therefrom, and a side surface 15c continued to the first surface 15a. The semiconductor layer 15 includes a first semiconductor layer 11 and a second semiconductor layer 12. The second semiconductor layer 12 includes a light emitting layer 12a. The side surface 15c of the semiconductor layer 15 is a side surface of the first semiconductor layer 11.

The second surface of the semiconductor layer 15 is processed into an uneven shape, and part of the light emitting layer 12a is removed. Thus, the second surface of the semiconductor layer 15 includes an emitting region 3 including the light emitting layer 12a, and a non-emitting region 4 not including the light emitting layer 12a.

The p-side electrode 13 is provided on the second surface in the emitting region 3. The n-side electrode 14 is provided on the second surface in the non-emitting region 4.

On the step portion between the second semiconductor layer 12 and the first semiconductor layer 11, as shown in FIG. 13, an insulating film 35 is formed. The insulating film 35 is e.g. a silicon oxide film. The insulating film 35 covers the side surface (end portion) of the light emitting layer 12a.

The p-side electrode 13 is covered with a p-side pad 16. The n-side electrode 14 is covered with an n-side pad 17. The p-side pad 16 and the n-side pad 17 are made of metal material and function for electrode protection and as a reflection film.

On the second surface side, an inorganic insulating film 36 is further provided. The inorganic insulating film 36 is e.g. a silicon nitride film. Alternatively, the inorganic insulating film 36 may be a silicon oxide film or silicon oxynitride film.

The inorganic insulating film 36 covers the second surface of the semiconductor layer 15, the insulating film 35 provided on the second surface, the p-side pad 16, and the n-side pad 17. Furthermore, the inorganic insulating film 36 covers the side surface 15c of the semiconductor layer 15.

On the inorganic insulating film 36, via a metal film 42 shown in FIG. 13, a p-side interconnection layer 18 and an n-side interconnection layer 19 are provided and spaced from each other. Furthermore, on the inorganic insulating film 36, via the metal film 42, a metal film 41 is provided.

The p-side interconnection layer 18, the n-side interconnection layer 19, and the metal film 41 are simultaneously formed by the electrolytic plating method using the metal film 42 as a seed layer. Thus, the p-side interconnection layer 18, the n-side interconnection layer 19, and the metal film 41 are made of the same material (e.g., copper).

The metal film 42 used as a seed layer is e.g. a stacked film of an aluminum (Al) film, a titanium (Ti) film, and a copper (Cu) film. The aluminum film is formed on the inorganic insulating film 36. The titanium film is formed on the aluminum film. The copper film is formed on the titanium film. The thickness of the metal film 42 is thinner than each thickness of the p-side interconnection layer 18 and the n-side interconnection layer 19.

The p-side interconnection layer 18 is electrically connected to the p-side pad 16 and the p-side electrode 13 through a plurality of p-side vias 18a penetrating through the inorganic insulating film 36 to the p-side pad 16. The p-side via 18a is provided in a first opening penetrating through the inorganic insulating film 36 to the p-side pad 16. The metal film 42 used as a seed layer is formed also on the inner wall of the first opening. By the aforementioned electrolytic plating, part of the p-side interconnection layer 18 is formed as the p-side via 18a in the first opening.

The n-side interconnection layer 19 is electrically connected to the n-side pad 17 and the n-side electrode 14 through an n-side via 19a penetrating through the inorganic insulating film 36 to the n-side pad 17. The n-side via 19a is provided in a second opening penetrating through the inorganic insulating film 36 to the n-side pad 17. The metal film 42 used as a seed layer is formed also on the inner wall of the second opening. By the aforementioned electrolytic plating, part of the n-side interconnection layer 19 is formed as the n-side via 19a in the second opening.

On the p-side interconnection layer 18, a p-side metal pillar 21 thicker than the p-side interconnection layer 18 is provided. The metal film 42, the p-side interconnection layer 18, and the p-side metal pillar 21 constitute a p-side interconnection section responsible for electrical connection between the p-side electrode 13 and an external circuit.

On the n-side interconnection layer 19, an n-side metal pillar 22 thicker than the n-side interconnection layer 19 is provided. The metal film 42, the n-side interconnection layer 19, and the n-side metal pillar 22 constitute an n-side interconnection section responsible for electrical connection between the n-side electrode 14 and an external circuit.

On the inorganic insulating film 36, on the p-side interconnection layer 18, and on the n-side interconnection layer 19, a resin layer 33 is provided. The resin layer 33 covers the periphery of the p-side interconnection section and the periphery of the n-side interconnection section.

The resin layer 33 is provided between the p-side interconnection layer 18 and the n-side interconnection layer 19. The resin layer 33 covers the side surface of the p-side interconnection layer 18 and the side surface of the n-side interconnection layer 19. Furthermore, the resin layer 33 is provided between the p-side metal pillar 21 and the n-side metal pillar 22. The resin layer 33 covers the side surface of the p-side metal pillar 21 and the side surface of the n-side metal pillar 22.

The surface of the p-side metal pillar 21 on the opposite side from the p-side interconnection layer 18 is not covered with the resin layer 33 but exposed, and functions as a p-side external terminal 21a to be bonded to a mounting substrate. The surface of the n-side metal pillar 22 on the opposite side from the n-side interconnection layer 19 is not covered with the resin layer 33 but exposed, and functions as an n-side external terminal 22a to be bonded to the mounting substrate.

On the first surface 15a of the semiconductor layer 15, a phosphor layer 40 is provided. The phosphor layer 40 includes phosphor particles capable of absorbing emission light (excitation light) of the light emitting layer 12a and emitting wavelength converted light. As shown in FIG. 13, the phosphor particles include e.g. green phosphor particles 62 absorbing excitation light of the light emitting layer 12a and emitting green light, and red phosphor particles 63 absorbing excitation light of the light emitting layer 12a and emitting red light.

Figure 27:
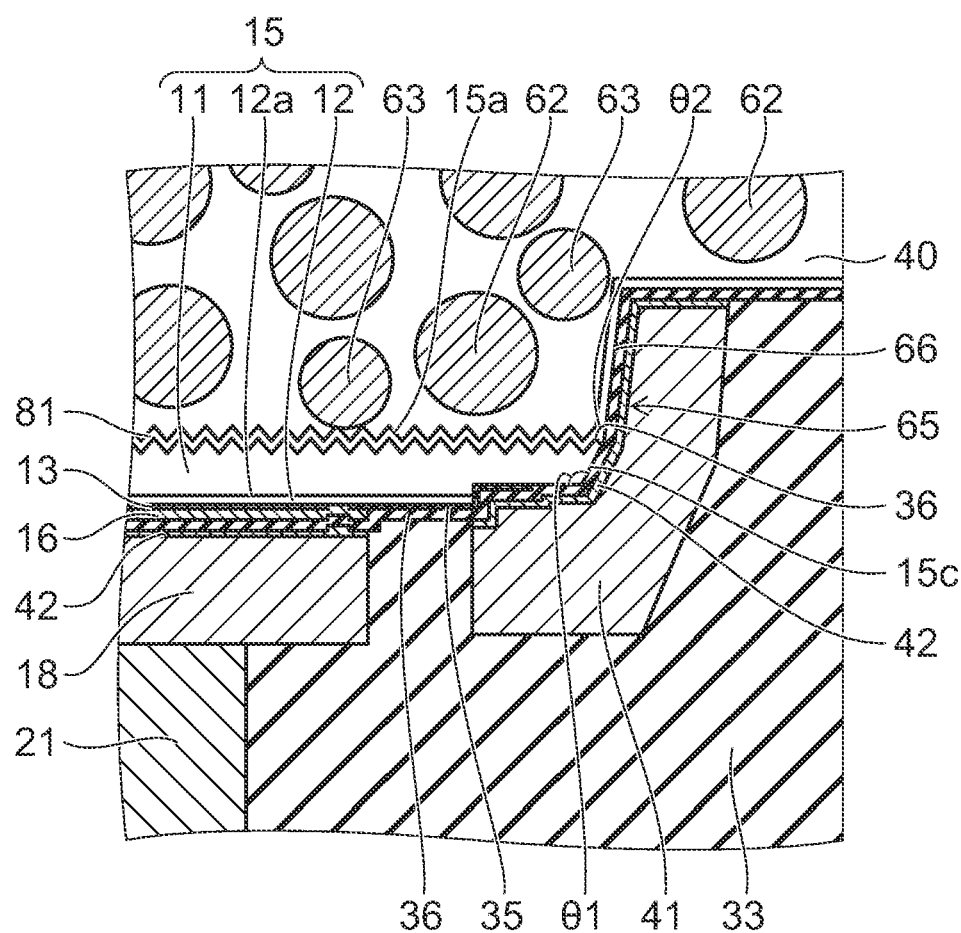
FIG. 27 is a schematic sectional view of a structure in which an adhesion layer 81 is provided in the semiconductor light emitting device of FIG. 13.

On the first surface 15a of the semiconductor layer 15, fine unevenness is formed to improve the light extraction efficiency. As shown in FIG. 27, as in the first embodiment, an adhesion layer 81 may be provided between the first surface 15a and the phosphor layer 40. The adhesion layer 81 has higher adhesive force to the phosphor layer 40 than the semiconductor layer 15. Hence, peeling of the phosphor layer 40 from the semiconductor layer 15 is prevented. Thus, the reliability can be improved.

The phosphor layer 40 is provided not only on the first surface 15a of the semiconductor layer 15, but also on the region outside the first surface 15a and the side surface 15c along the surface.

In the phosphor layer 40, between the portion provided on the first surface 15a of the semiconductor layer 15 and the portion provided outside the first surface 15a, as shown in FIG. 13, a step portion 65 is formed.

On the surface of the step portion 65 of the phosphor layer 40 (in the case where the adhesion layer 81 is formed, the surface thereof can also be regarded as the surface of the step portion 65), the inorganic insulating film 36 is formed. The step portion 65 has a side surface 66 continued to the side surface 15c of the semiconductor layer 15. The inorganic insulating film 36 is continuously formed from the side surface 15c of the semiconductor layer 15 to the side surface 66 of the step portion 65.

Also on the inorganic insulating film 36 provided on the side surface 15c of the semiconductor layer 15 and the side surface 66 of the step portion 65 of the phosphor layer 40, the aforementioned metal film 42 used as a seed layer is formed. On the metal film 42, a metal film 41 is formed at the time of the aforementioned electrolytic plating.

Thus, the side surface 15c of the semiconductor layer 15 and the side surface 66 of the step portion 65 of the phosphor layer 40 are covered with the metal film 42 and the metal film 41 via the inorganic insulating film 36.

As shown in FIG. 12A, the metal film 41 continuously surrounds the periphery of the side surface 15c of the semiconductor layer 15, and is formed integrally with the n-side interconnection layer 19. Thus, the metal film 41 is electrically connected to the n-side interconnection layer 19.

The metal film 41 is separated from the p-side interconnection layer 18. The metal film (seed layer) 42 underlying the metal film 41 is also separated from the metal film (seed layer) 42 underlying the p-side interconnection layer 18.

Thus, the metal film 41 is not electrically connected to the p-side interconnection layer 18.

By integrally forming the metal film 41 and the n-side interconnection layer 19, a wide heat dissipation path can be realized. Furthermore, a large area for forming the n-side metal pillar 22 can also be ensured on the n-side interconnection layer 19. Thus, an n-side metal pillar 22 having a wide width (large cross-sectional area) can be formed. As the width of the n-side metal pillar 22 becomes wider, the area of solder bonded to the n-side external terminal 22a can also be made larger. The n-side external terminal 22a serves as an end surface of the n-side metal pillar 22 at the time of mounting onto a mounting substrate. Thus, heat dissipation to the mounting substrate through the n-side interconnection layer 19, the n-side metal pillar 22, and the solder can be improved.

The side surface 15c is the side surface 15c of the first semiconductor layer 11 not including the light emitting layer 12a. The inorganic insulating film 36 is interposed between the side surface 15c and the metal film 41. However, if a short circuit occurs between the side surface 15c and the metal film 41, the first semiconductor layer 11 is electrically connected to the n-side interconnection layer 19. The current path between the first semiconductor layer 11 and the n-side interconnection layer 19 is a normal current path, and causes no problem.

Alternatively, as shown in FIG. 12B, the metal film 41 may be separated from the n-side interconnection layer 19, and may not be electrically connected to the n-side interconnection layer 19.

According to the second embodiment, the side surface 15c of the semiconductor layer 15 is covered with the metal film 42 and the metal film 41. The metal film 42 and the metal film 41 have a light blocking property for the light emitted from the light emitting layer 12a. This can reduce color breakup due to leakage of the emission light (e.g., blue light) of the light emitting layer 12a from the side surface 15c of the semiconductor layer 15 without passing through the phosphor layer 40. Thus, a uniform color can be obtained when the semiconductor light emitting device is viewed from any direction.

Furthermore, the metal film 42 contains aluminum having high reflectance to the emission light of the light emitting layer 12a. Thus, the lateral light reaching the side surface 15c of the semiconductor layer 15 from the light emitting layer 12a can be reflected by the metal film 42 toward the phosphor layer 40 thereabove to achieve a high light extraction efficiency.

Furthermore, on the side surface 15c of the semiconductor layer 15, the inorganic insulating film 36 is formed. Light absorption occurs in metal reflection. However, in inorganic film reflection, depending on the condition, a reflectance of 100% can be achieved.

For instance, from the side surface 15c of GaN having a refractive index of approximately 2.4, light is incident on the inorganic insulating film 36 of a silicon oxide film having a lower refractive index (approximately 1.5) than GaN. This light is reflected due to the refractive index difference. Furthermore, in the case where the incident angle to the interface between GaN and the inorganic insulating film 36 is larger than the escape cone, light can be totally reflected.

Furthermore, if the film thickness of the inorganic insulating film 36 is set to half the emission wavelength of the light emitting layer 12a, the amplitude of reflection at the interface between GaN (first semiconductor layer 11) and the inorganic insulating film 36 overlaps the amplitude of reflection at the interface between the inorganic insulating film 36 and the metal film 42. This increases the reflectance.

The surface of the metal film 41 is covered with the resin layer 33. In the case of the planar layout of FIG. 12A, the resin layer 33 is provided between the metal film 41 and the p-side interconnection layer 18. In the case of the planar layout of FIG. 12B, the resin layer 33 is provided between the metal film 41 and the p-side interconnection layer 18, and between the metal film 41 and the n-side interconnection layer 19.

The resin layer 33 is made of black resin having a light blocking property for the emission light of the light emitting layer 12a. The resin layer 33 covers the side surface of the metal film 41. Thus, the resin layer 33 also functions as a light blocking body for preventing leakage of the emission light from the side surface 15c of the semiconductor layer 15.

Alternatively, the resin layer 33 may be made of e.g. white resin reflective to the emission light of the light emitting layer 12a. In this case, the resin layer 33 also functions as a reflective body for reflecting light upward while preventing leakage of the emission light from the side surface 15c.

The side surface 15c of the semiconductor layer 15 is formed in a tapered shape, not perpendicular but oblique to the first surface 15a and the second surface. By the tapered shape of the side surface 15c, the light incident on the side surface 15c can be effectively reflected toward the phosphor layer 40. This can reduce self-absorption loss inside the semiconductor layer 15.

In the phosphor layer 40, the step portion 65 is formed near the end portion of the semiconductor layer 15. The side surface 66 of the step portion 65 is continued to the side surface 15c of the semiconductor layer 15. The side surface 66 is also formed in a tapered shape oblique to the first surface 15a and the second surface of the semiconductor layer 15.

Also on the side surface 66 of the step portion 65, the metal film 42 and the metal film 41 are provided via the inorganic insulating film 36. The metal film 42 and the metal film 41 function as a reflective body for light leaking from the side surface 66 of the step portion 65. This suppresses leakage of the excitation light traveling a short distance in the phosphor layer 40, and can reduce color breakup.

The inclination angle ($\theta 1$ in FIG. 13) of the side surface 15c of the semiconductor layer 15 with respect to the second surface and the inclination angle ($\theta 2$ in FIG. 13) of the side surface 66 of the step portion 65 of the phosphor layer 40 with respect to the first surface 15a are appropriately set. This can control the directivity of light emitted outside from the semiconductor light emitting device.

For instance, if $\theta 2$ is made smaller than $\theta 1$, the directivity can be made narrower than in the case where $\theta 2$ is made larger than $\theta 1$. Conversely, if $\theta 2$ is made larger than $\theta 1$, the directivity can be made wider than in the case where $\theta 2$ is made smaller than $\theta 1$.

The inclination angle of the side surface 15c of the semiconductor layer 15 can be controlled by the side surface shape of the aforementioned sacrificial layer 51. The inclination angle of the side surface 66 of the step portion 65 of the phosphor layer 40 depends on the inclination angle of the side surface 71a of the recess 71 formed in the substrate 10 described later with reference to FIG. 14. The inclination angle of the side surface 71a of this recess 71 can be controlled by the etching condition for forming the recess 71.

Between the side surface 15c of the semiconductor layer 15 and the metal film 42, and between the side surface 66 of the step portion 65 of the phosphor layer 40 and the metal film 42, the inorganic insulating film 36 is provided. The inorganic insulating film 36 has high adhesive force to the semiconductor layer 15, the phosphor layer 40, and the metal film 42. This enhances the reliability of the state in which the side surface 15c of the semiconductor layer 15 and the side surface 66 of the step portion 65 of the phosphor layer 40 are covered with the metal film 42 and the metal film 41.

Next, a method for manufacturing a semiconductor light emitting device of the second embodiment is described.

The process up to the step shown in FIG. 3D is performed similarly to that of the first embodiment described above. More specifically, on a substrate 10 being e.g. a silicon substrate, on the portion constituting a device separation region, a sacrificial layer 51 is previously formed. In this state, a semiconductor layer 15 is formed on the substrate 10. On the substrate 10, the semiconductor layer 15 is formed in the state of being already device-separated into a plurality by the sacrificial layer 51. This eliminates the need to separate the semiconductor layer 15 after forming the electrodes 13, 14, pads 16, 17 and the like. Thus, the device separation process can be simplified.

Figure 14:
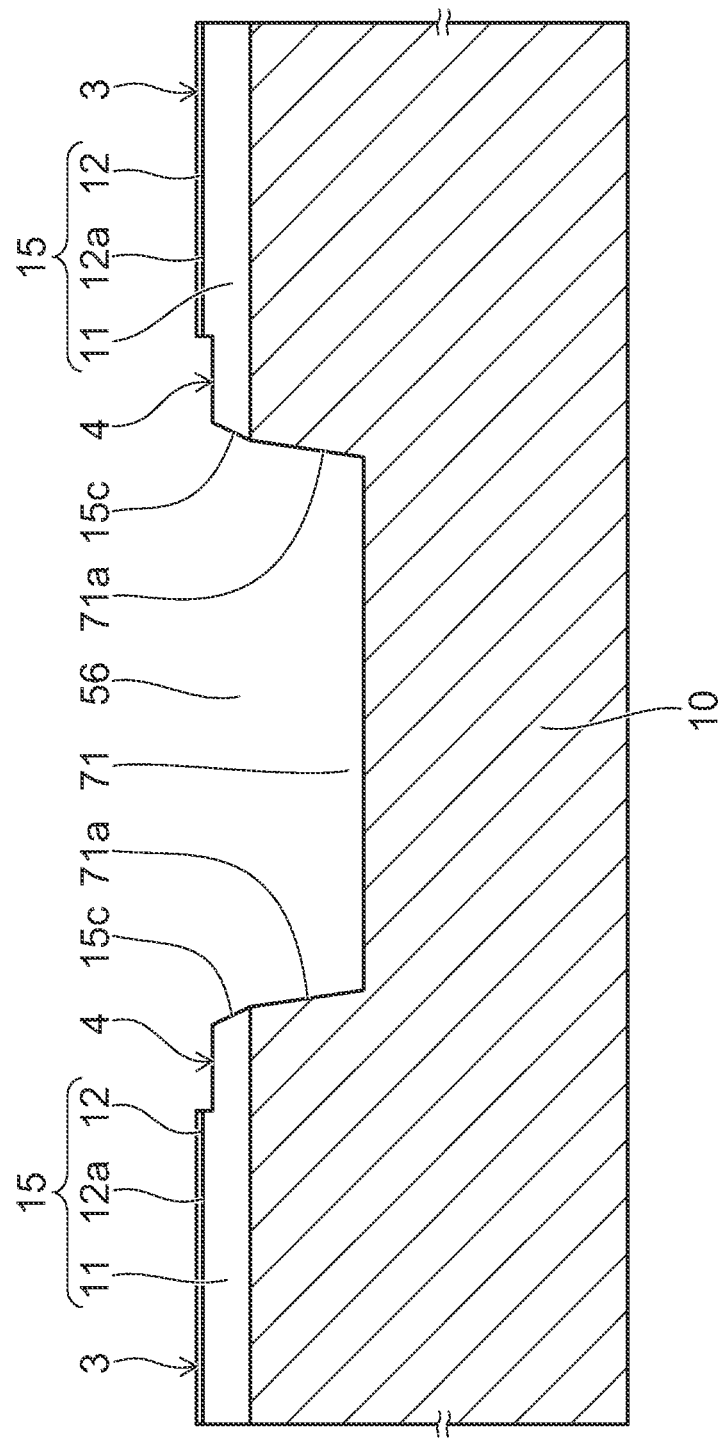
FIGS. 14 to 17 are schematic sectional views showing a method for manufacturing of the semiconductor light emitting device of the second embodiment.

Furthermore, in the second embodiment, after the sacrificial layer 51 is removed, the substrate 10 below the trench 56 separating the semiconductor layer 15 is etched to form a recess 71 on the front surface side of the substrate 10 as shown in FIG. 14. The side surface 71a of the recess 71 is continued to the side surface 15c of the semiconductor layer 15. Because the substrate 10 is a silicon substrate, it can be easily etched.

Alternatively, without using the sacrificial layer 51, the semiconductor layer 15 may be formed on the entire surface of the substrate 10. Then, by etching using a mask, the semiconductor layer 15 is separated into a plurality on the substrate 10. Subsequently, the substrate 10 below the trench between the separated semiconductor layers 15 is etched using the aforementioned mask. Thus, a recess 71 may be formed in the substrate 10.

Figure 15:
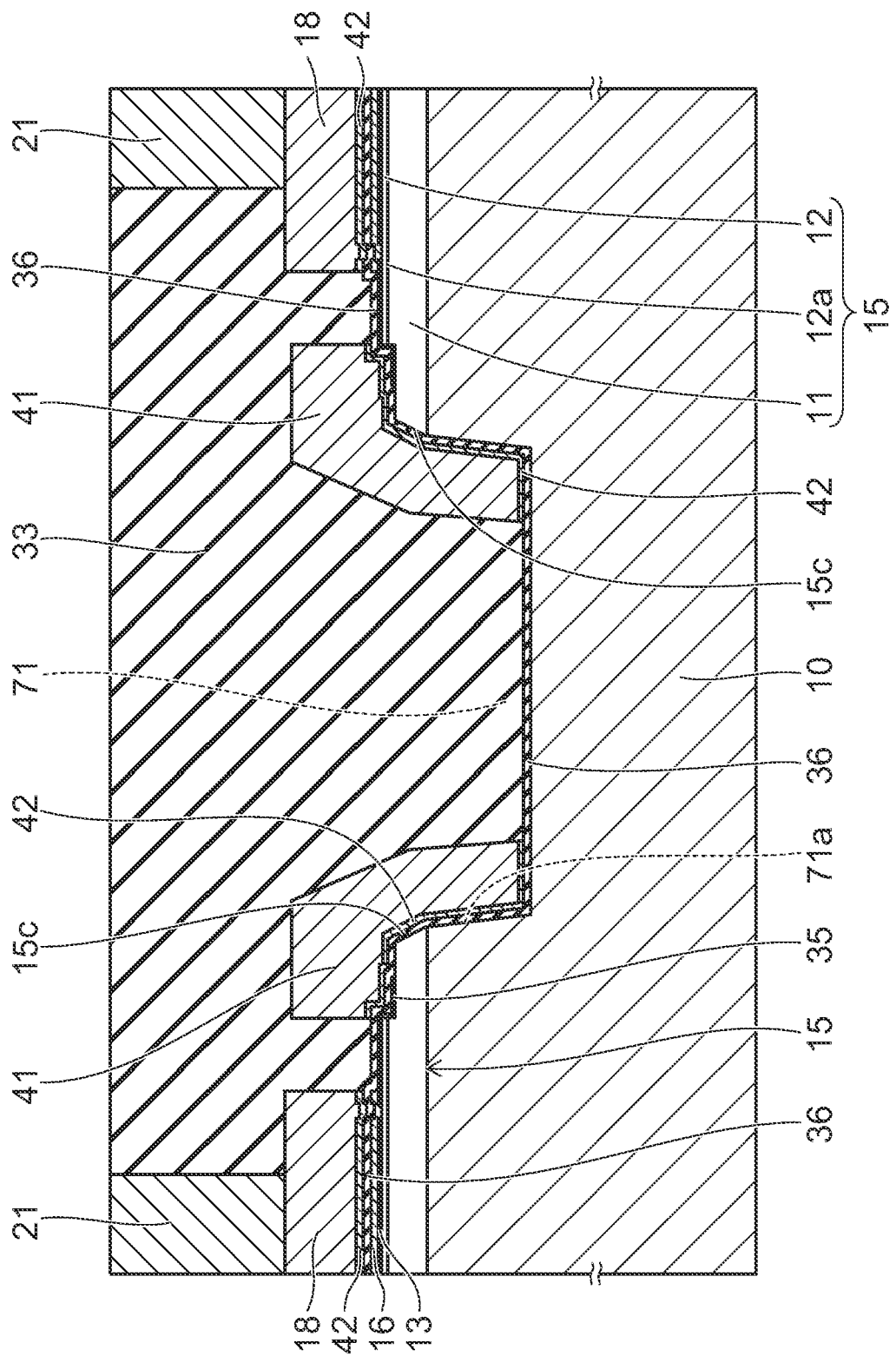

Then, as in the first embodiment, on the second surface of the semiconductor layer 15, a p-side electrode 13, an n-side electrode 14, a p-side pad 16, and an n-side pad 17 are formed. Furthermore, an inorganic insulating film 36 is formed. As shown in FIG. 15, the inorganic insulating film 36 is formed also on the side surface 15c of the semiconductor layer 15, the side surface 71a of the recess 71 continued to the side surface 15c, and the bottom surface of the recess 71.

On the inorganic insulating film 36, a metal film 42 is formed. The metal film 42 is also on the side surface 15c of the semiconductor layer 15 and the inorganic insulating film 36 formed on the side surface 71a of the recess 71.

On the metal film 42, a plating resist, not shown, is formed. By the electrolytic plating method using the metal film 42 as a seed layer, a p-side interconnection layer 18, an n-side interconnection layer 19, and a metal film 41 are formed on the metal film 42.

Furthermore, by the electrolytic plating method using the metal film 42 as a seed layer, a p-side metal pillar 21 is formed on the p-side interconnection layer 18, and an n-side metal pillar 22 is formed on the n-side interconnection layer 19.

After the p-side metal pillar 21 and the n-side metal pillar 22 are formed, the exposed portion of the metal film 42 is removed by etching. The electrical connection between the p-side interconnection layer 18 and the n-side interconnection layer 19 through the metal film 42 is broken. In the case of the layout of FIG. 12A, the electrical connection between the p-side interconnection layer 18 and the metal film 41 through the metal film 42 is broken. In the case of the layout of FIG. 12B, the electrical connection between the p-side interconnection layer 18 and the metal film 41 through the metal film 42, and the electrical connection between the n-side interconnection layer 19 and the metal film 41 through the metal film 42 are broken.

Then, a resin layer 33 is formed on the second surface side. As shown in FIG. 15, the resin layer 33 is buried also in the recess 71.

Figure 16:
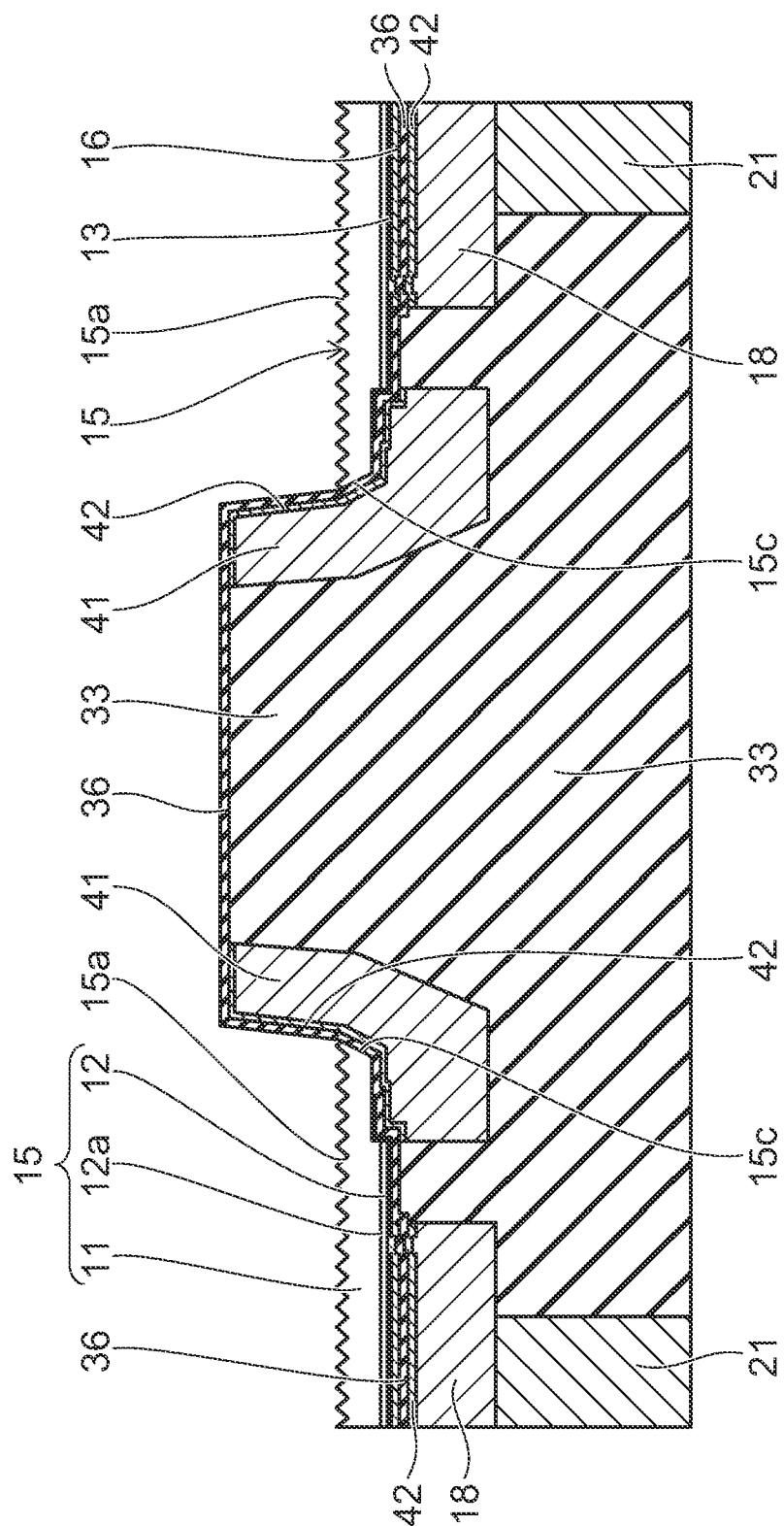

After the resin layer 33 is formed, the substrate (silicon substrate) 10 is removed by etching. FIG. 16 shows a wafer cross section after the removal of the substrate 10, shown upside down from FIG. 15.

By the removal of the substrate 10, the first surface 15a of the semiconductor layer 15 is exposed. On the first surface 15a, fine unevenness is formed to increase the light extraction efficiency.

By the removal of the substrate 10, the inorganic insulating film 36, the metal film 42, the metal film 41, and the resin layer 33 formed in the recess 71 of the substrate 10 are projected from the first surface 15a of the semiconductor layer 15.

Figure 17:
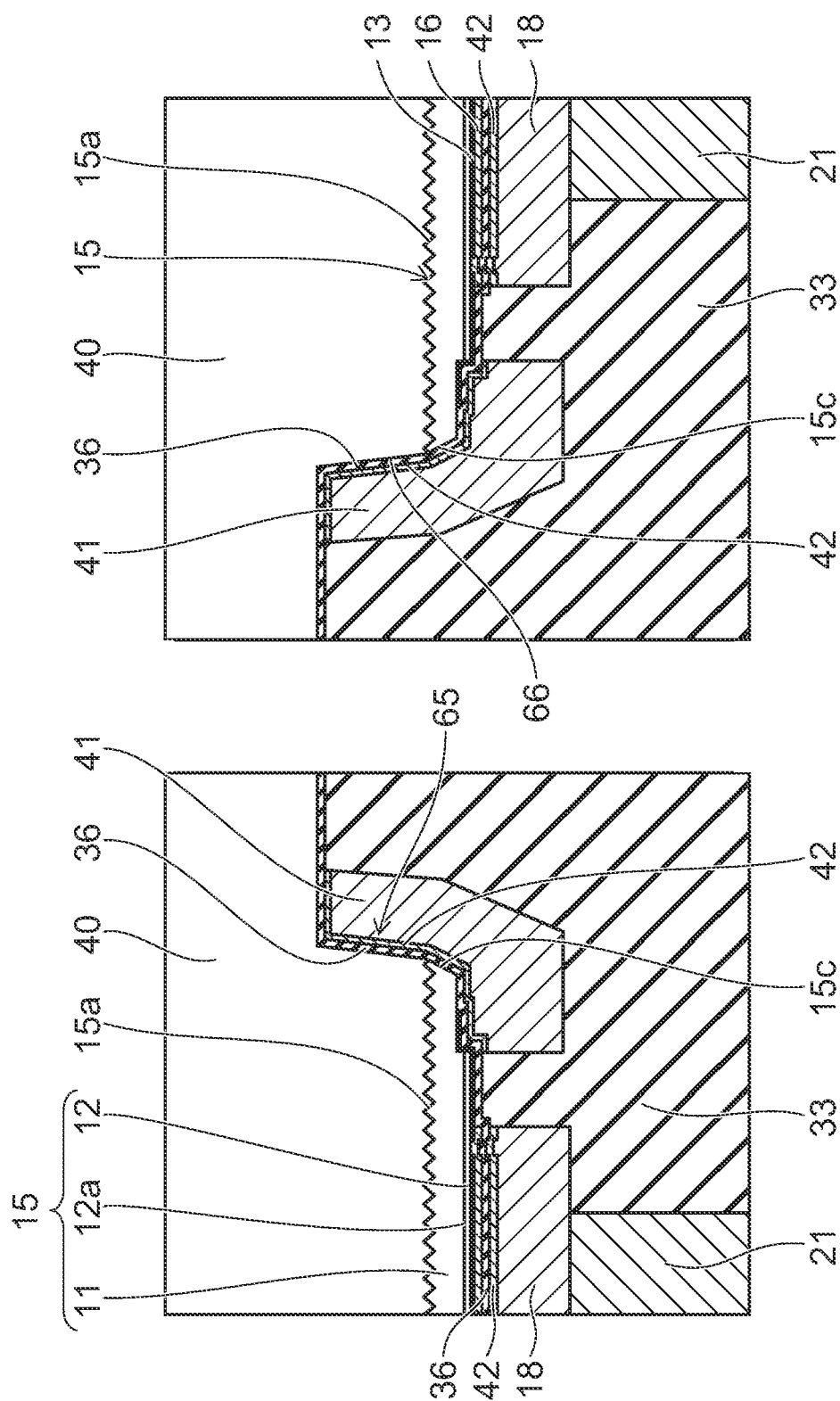

After the substrate 10 is removed, a phosphor layer 40 is formed on the first surface 15a. As shown in FIG. 17, the phosphor layer 40 is formed via an adhesion layer 81 also on the side surface and top surface of the inorganic insulating film 36 projected from the first surface 15a.

Thus, on the phosphor layer 40, a step portion 65 having a side surface 66 continued to the side surface 15c of the semiconductor layer 15 is formed.

After the phosphor layer 40 is formed, in the portion where the inorganic insulating film 36 and the resin layer 33 are projected from the first surface 15a of the semiconductor layer 15, as shown in FIG. 17, the phosphor layer 40, the inorganic insulating film 36, and the resin layer 33 are cut and singulated into a plurality of semiconductor light emitting devices.

Figure 18A:
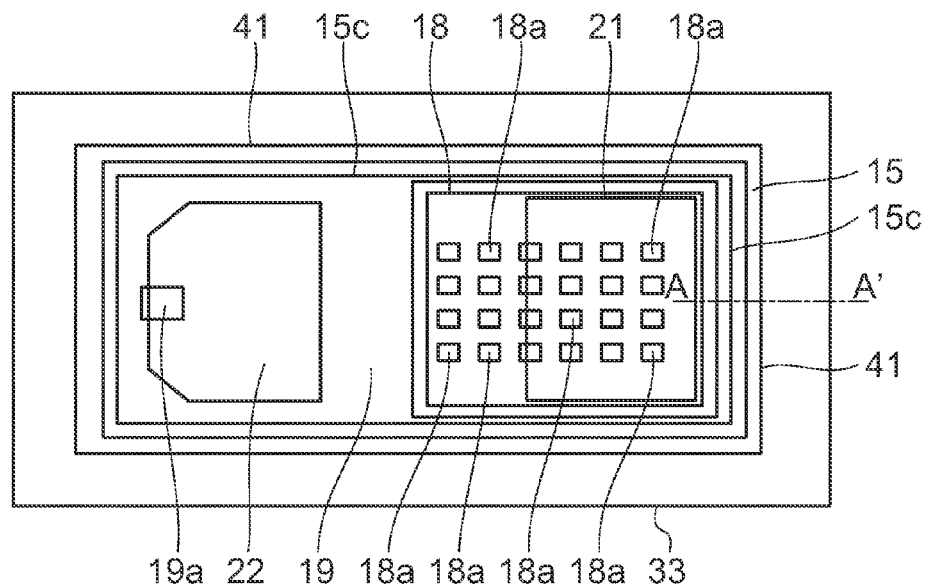
FIGS. 18A and 18B are schematic plan views of another example of the semiconductor light emitting device of the second embodiment.
Figure 18B:
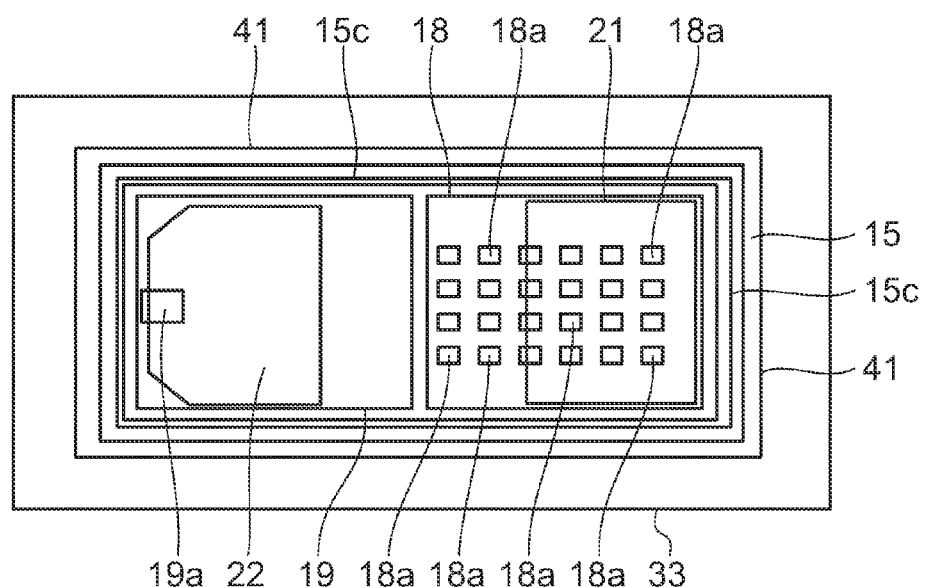

FIGS. 18A and 18B are schematic plan views of a semiconductor light emitting device of a variation of the second embodiment.

Figure 19:
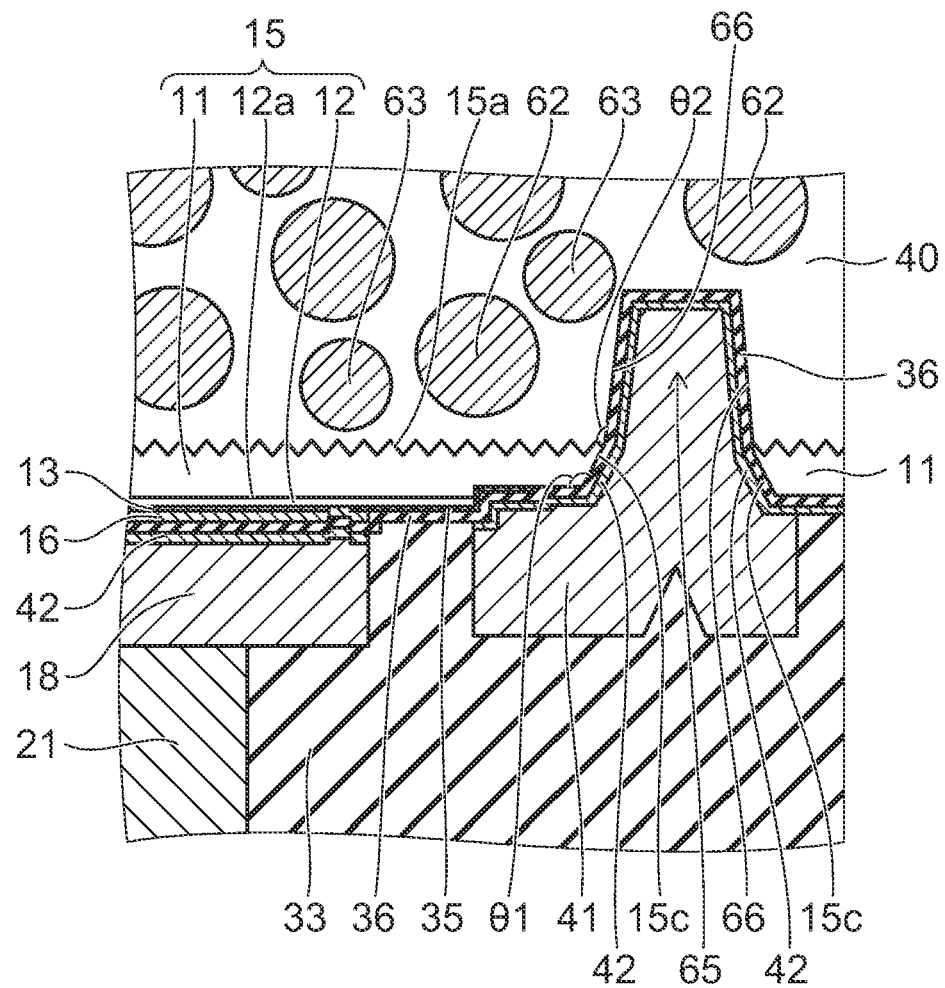
FIG. 19 is an enlarged sectional view taken along line A-A' in FIG. 18A.

FIG. 19 is an enlarged sectional view taken along line A-A' in FIG. 18A.

Also in this semiconductor light emitting device, as shown in FIG. 19, a step portion 65 of the phosphor layer 40 is provided on the end portion of the semiconductor layer 15. The side surface 66 of the step portion 65 is continued to the side surface 15c of the semiconductor layer 15.

Furthermore, an inorganic insulating film 36, a metal film 42, and a metal film 41 are formed so as to cover the step portion 65. The inorganic insulating film 36, the metal film 42, and the metal film 41 divide the first semiconductor layer 11 not including the light emitting layer 12a.

Thus, outside the side surface 15c of the semiconductor layer 15 including the light emitting layer 12a, the first semiconductor layer 11 is provided via the inorganic insulating film 36, the metal film 42, and the metal film 41.

As shown in FIG. 18A, the metal film 41 dividing the first semiconductor layer 11 continuously surrounds the periphery of the side surface 15c of the semiconductor layer 15, and is formed integrally with the n-side interconnection layer 19. Thus, the metal film 41 is electrically connected to the n-side interconnection layer 19.

Alternatively, as shown in FIG. 18B, the metal film 41 may be separated from the n-side interconnection layer 19, and may not be electrically connected to the n-side interconnection layer 19.

As shown in FIGS. 18A and 18B, the first semiconductor layer 11 formed outside the metal film 41 continuously surrounds the periphery of the metal film 41. On the first semiconductor layer 11 formed outside the metal film 41, the n-side electrode 14 and the n-side pad 17 are not formed. The surface of the first semiconductor layer 11 is covered with the inorganic insulating film 36.

Also in the semiconductor light emitting device shown in FIG. 19, the metal film 42 and the metal film 41 have a light blocking property for the light emitted from the light emitting layer 12a. This can reduce color breakup due to leakage of the emission light (e.g., blue light) of the light emitting layer 12a from the side surface 15c of the semiconductor layer 15 without passing through the phosphor layer 40. Thus, a uniform color can be obtained when the semiconductor light emitting device is viewed from any direction.

Furthermore, the metal film 42 contains aluminum having high reflectance to the emission light of the light emitting layer 12a. Thus, the lateral light reaching the side surface 15c of the semiconductor layer 15 from the light emitting layer 12a can be reflected by the metal film 42 toward the phosphor layer 40 thereabove to achieve a high light extraction efficiency. Furthermore, on the side surface 15c of the semiconductor layer 15, the inorganic insulating film 36 is formed. Thus, depending on the condition, total reflection can be achieved at the interface between the first semiconductor layer 11 and the inorganic insulating film 36.

Furthermore, by the side surface 15c in a tapered shape, the incident light to the side surface 15c can be effectively reflected toward the phosphor layer 40. This can reduce self-absorption loss inside the semiconductor layer 15.

Furthermore, the inclination angle ($\theta 1$ in FIG. 19) of the side surface 15c of the semiconductor layer 15 with respect to the second surface and the inclination angle ($\theta 2$ in FIG. 19) of the side surface 66 of the step portion 65 of the phosphor layer 40 with respect to the first surface 15a are appropriately set. This can control the directivity of light emitted outside from the semiconductor light emitting device.

For instance, if $\theta 2$ is made smaller than $\theta 1$, the directivity can be made narrower than in the case where $\theta 2$ is made larger than $\theta 1$. Conversely, if $\theta 2$ is made larger than $\theta 1$, the directivity can be made wider than in the case where $\theta 2$ is made smaller than $\theta 1$.

The inorganic insulating film 36 has high adhesive force to the semiconductor layer 15, the phosphor layer 40, and the metal film 42. This enhances the reliability of the state in which the side surface 15c of the semiconductor layer 15 and the side surface 66 of the step portion 65 of the phosphor layer 40 are covered with the metal film 42 and the metal film 41.

In forming the structure of FIG. 19, the process up to the step shown in FIG. 3D is performed similarly to that of the first embodiment described above. More specifically, on a substrate 10 being e.g. a silicon substrate, on the portion constituting a device separation region, a sacrificial layer 51 is previously formed. In this state, a semiconductor layer 15 is formed on the substrate 10. On the substrate 10, the semiconductor layer 15 is formed in the state of being already device-separated into a plurality by the sacrificial layer 51. This eliminates the need to separate the semiconductor layer 15 after forming the electrodes 13, 14, pads 16, 17 and the like. Thus, the device separation process can be simplified.

Figure 20:
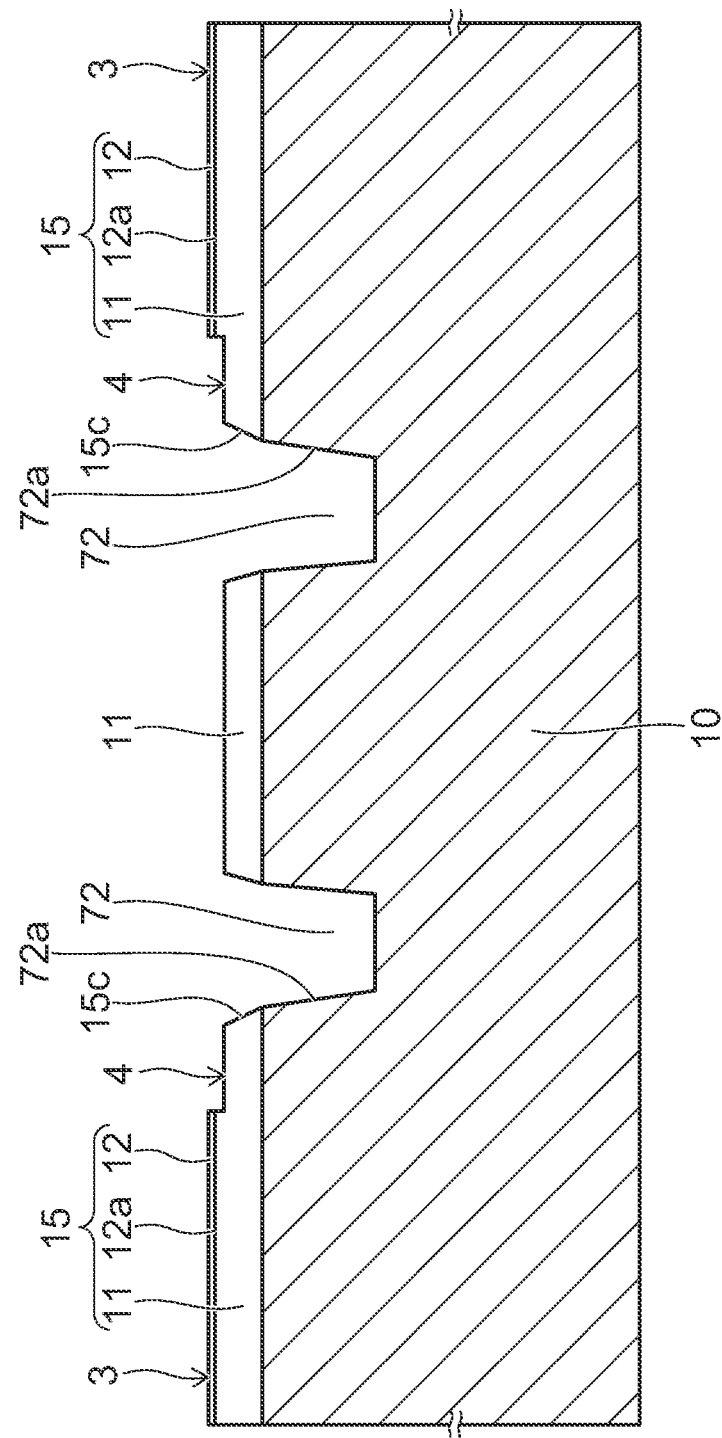
FIGS. 20 to 23 are schematic sectional views showing a method for manufacturing of a semiconductor light emitting device of another example of the second embodiment.

After the sacrificial layer 51 is removed, the substrate 10 below the trench 56 separating the semiconductor layer 15 is etched to form recesses 72 on the front surface side of the substrate 10 as shown in FIG. 20. At this time, two recesses 72 are formed so that the first semiconductor layer 11 not including the light emitting layer 12a remains between the adjacent semiconductor layers 15 including the light emitting layer 12a. The first semiconductor layer 11 is left on the substrate 10 between the two recesses 72. The side surface 72a of the recess 72 on the semiconductor layer 15 side is continued to the side surface 15c of the semiconductor layer 15.

Alternatively, without using the sacrificial layer 51, the semiconductor layer 15 may be formed on the entire surface of the substrate 10. Then, by etching using a mask, the semiconductor layer 15 is separated into a plurality on the substrate 10. Subsequently, the substrate 10 below the trench between the separated semiconductor layers 15 is etched using the aforementioned mask. Thus, recesses 72 may be formed in the substrate 10.

Figure 21:
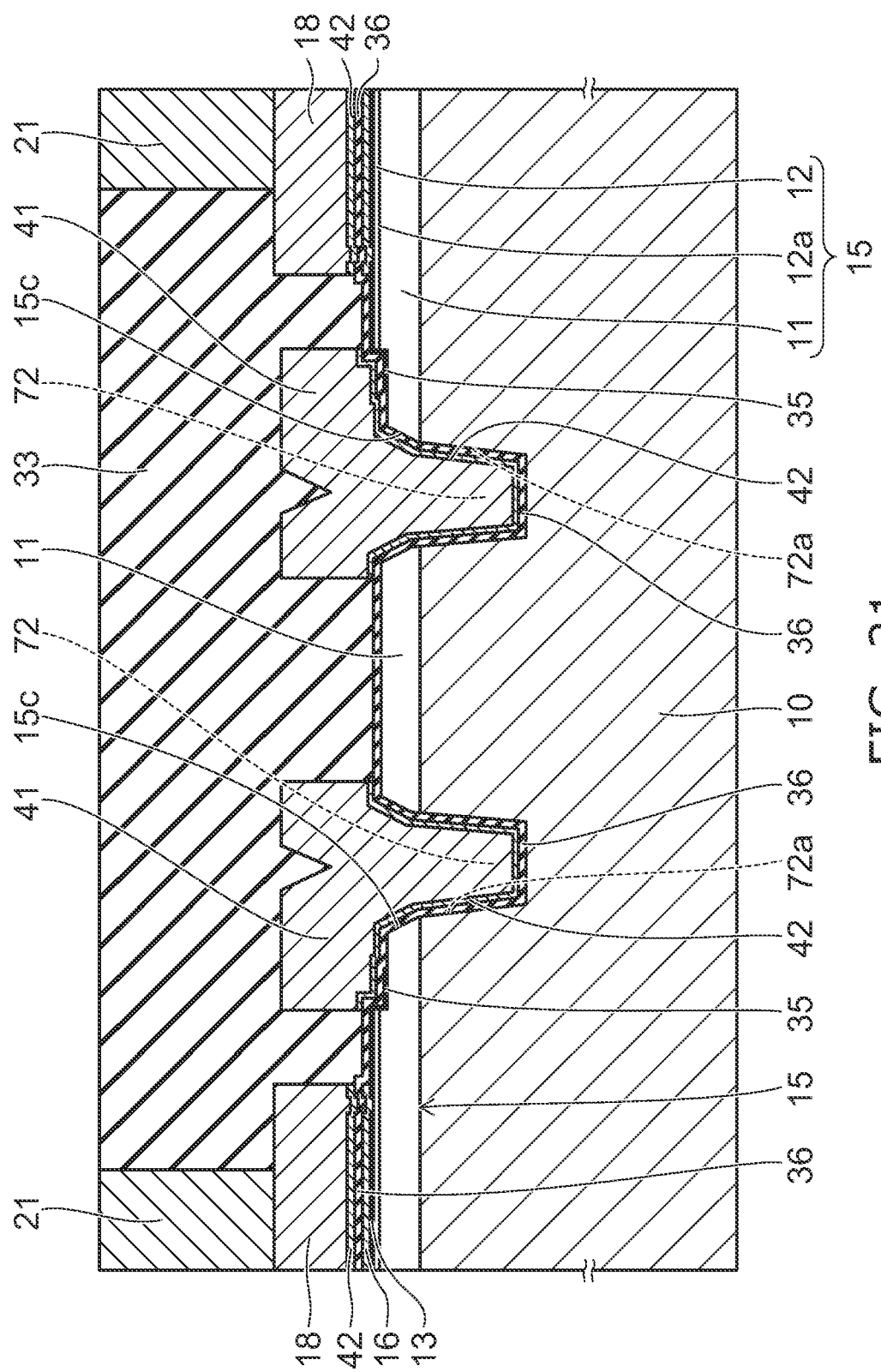

Then, as in the first embodiment, on the second surface of the semiconductor layer 15, a p-side electrode 13, an n-side electrode 14, a p-side pad 16, and an n-side pad 17 are formed. Furthermore, an inorganic insulating film 36 is formed. As shown in FIG. 21, the inorganic insulating film 36 is formed also on the side surface 15c of the semiconductor layer 15, the side surface 72a of the recess 72 continued to the side surface 15c, the bottom surface of the recess 72, and the surface of the first semiconductor layer 11 between the recesses 72.

On the inorganic insulating film 36, a metal film 42 is formed. On the metal film 42, a plating resist, not shown, is formed. By the electrolytic plating method using the metal film 42 as a seed layer, a p-side interconnection layer 18, an n-side interconnection layer 19, and a metal film 41 are formed on the metal film 42. The metal film 41 is buried in the recess 72 via the inorganic insulating film 36 and the metal film 42.

Furthermore, by the electrolytic plating method using the metal film 42 as a seed layer, a p-side metal pillar 21 is formed on the p-side interconnection layer 18, and an n-side metal pillar 22 is formed on the n-side interconnection layer 19.

After the p-side metal pillar 21 and the n-side metal pillar 22 are formed, the exposed portion of the metal film 42 is removed by etching. The electrical connection between the p-side interconnection layer 18 and the n-side interconnection layer 19 through the metal film 42 is broken. In the case of the layout of FIG. 18A, the electrical connection between the p-side interconnection layer 18 and the metal film 41 through the metal film 42 is broken. In the case of the layout of FIG. 18B, the electrical connection between the p-side interconnection layer 18 and the metal film 41 through the metal film 42, and the electrical connection between the n-side interconnection layer 19 and the metal film 41 through the metal film 42 are broken.

Figure 22:
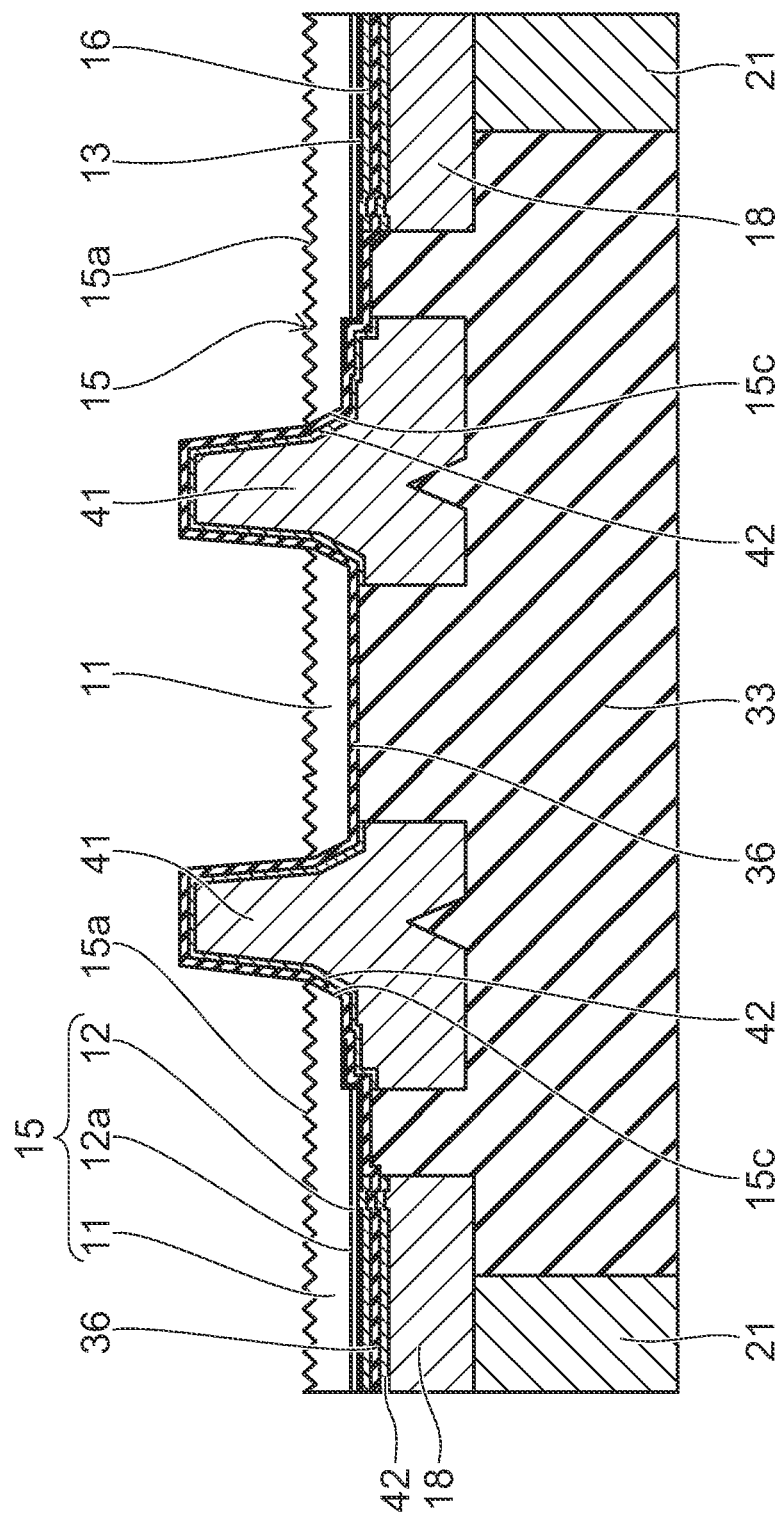

Then, after a resin layer 33 is formed, the substrate (silicon substrate) 10 is removed by etching. FIG. 22 shows a wafer cross section after the removal of the substrate 10, shown upside down from FIG. 21.

By the removal of the substrate 10, the first surface 15a of the semiconductor layer 15 is exposed. On the first surface 15a, fine unevenness is formed to increase the light extraction efficiency.

By the removal of the substrate 10, the inorganic insulating film 36, the metal film 42, and the metal film 41 formed in the recess 72 of the substrate 10 are projected from the first surface 15a of the semiconductor layer 15. Furthermore, the surface of the first semiconductor layer 11 between the projected portions of the metal film 41 is exposed.

The inorganic insulating film 36 is very thin, such as several hundred nm. Thus, there is concern about the possibility that the inorganic insulating film 36 supported by the soft resin layer 33 on the portion between the metal films 41 is broken. However, the inorganic insulating film 36 on the resin layer 33 is covered and protected with the first semiconductor layer 11 harder than the resin layer 33. This can suppress etching of the metal film 42 and the like with chemicals through the broken inorganic insulating film 36 at the time of removing the substrate 10 and at the time of frost treatment for forming fine unevenness at the first surface 15a.

Figure 23:
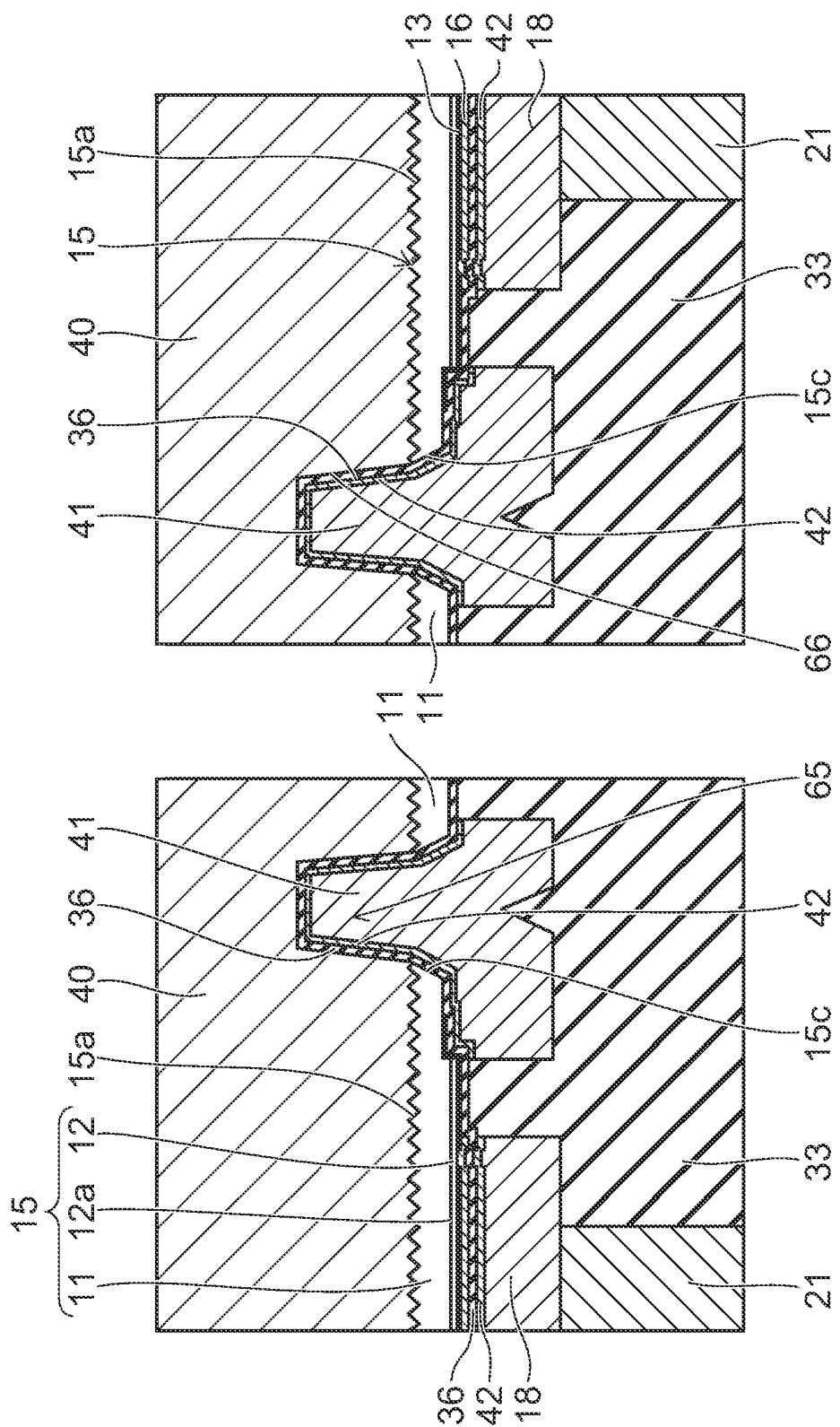

After the substrate 10 is removed, a phosphor layer 40 is formed on the first surface 15a. As shown in FIG. 23, the phosphor layer 40 is formed also on the side surface and top surface of the inorganic insulating film 36 projected from the first surface 15a.

Thus, on the phosphor layer 40, a step portion 65 having a side surface 66 continued to the side surface 15c of the semiconductor layer 15 is formed.

After the phosphor layer 40 is formed, in the portion between the metal films 41, as shown in FIG. 23, the phosphor layer 40, the first semiconductor layer 11, the inorganic insulating film 36, and the resin layer 33 are cut and singulated into a plurality of semiconductor light emitting devices.

Figure 28:
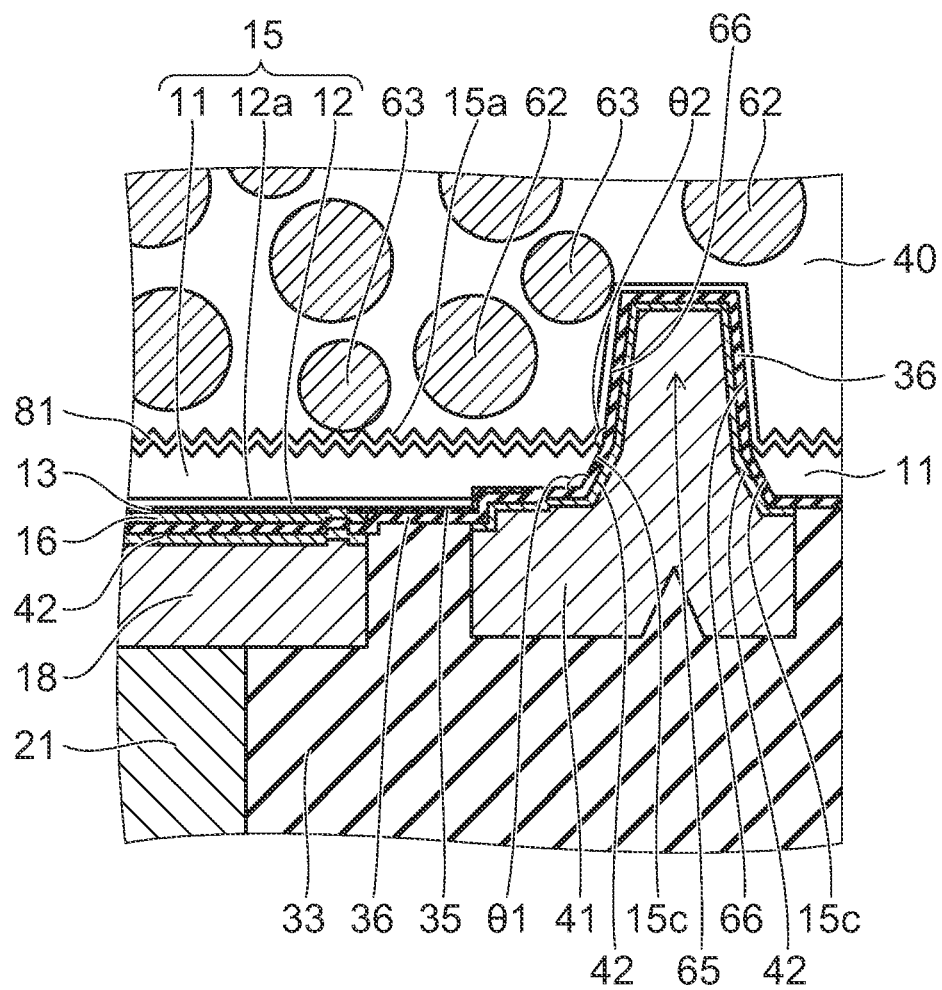
FIG. 28 is a schematic sectional view of a structure in which an adhesion layer 81 is provided in the semiconductor light emitting device of FIG. 19.

Also in the structure of FIG. 19, as shown in FIG. 28, an adhesion layer 81 may be provided between the first surface 15a of the semiconductor layer 15 and the phosphor layer 40.

Figure 24:
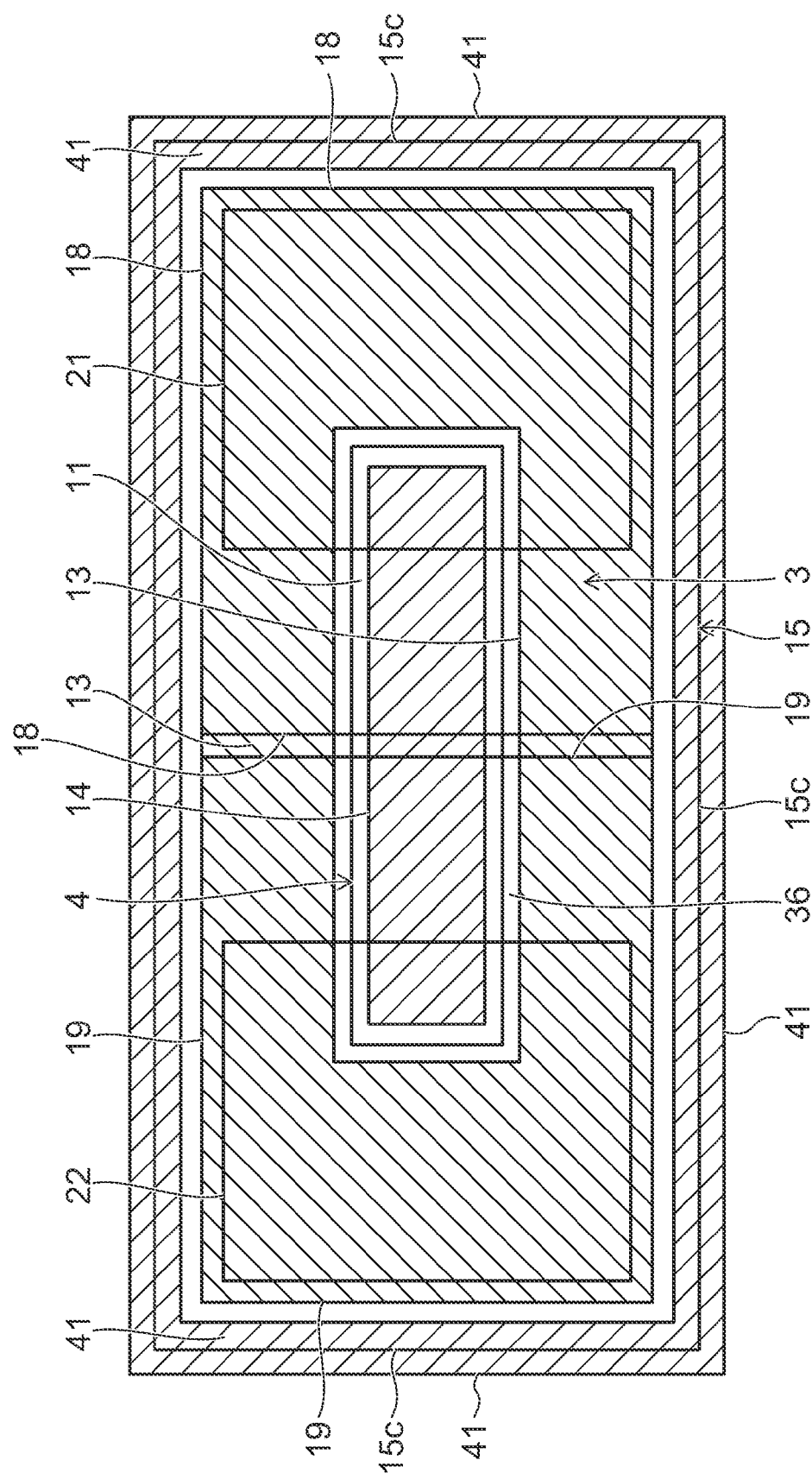
FIG. 24 is a schematic plan view of the other example of the semiconductor light emitting device of the second embodiment.

FIG. 24 is a schematic plan view showing another example of the planar layout of the n-side electrode 14 and the p-side electrode 13 in the semiconductor device of the second embodiment.

In FIG. 24, the region of the metal film 41 covering the n-side electrode 14, the p-side electrode 13, and the first surface 15a of the semiconductor layer 15 is hatched.

At the center of the second surface of the semiconductor layer 15, the first semiconductor layer 11 is exposed, and a non-emitting region 4 not including the light emitting layer 12a is formed. On the non-emitting region 4, the n-side electrode 14 is provided.

On the second surface of the semiconductor layer 15, an emitting region 3 including the light emitting layer 12a is formed around the non-emitting region 4. On the emitting region 3, the p-side electrode 13 is provided. In plan view of the second surface of the semiconductor layer 15, the p-side electrode 13 surrounds the periphery of the n-side electrode 14. An insulating film is provided between the n-side electrode 14 and the p-side electrode 13.

On the n-side electrode 14 and the p-side electrode 13, the aforementioned inorganic insulating film 36 is provided. Through an n-side via penetrating through the inorganic insulating film 36, the n-side electrode 14 is connected to the n-side interconnection layer 19 provided on the inorganic insulating film 36. Through a p-side via penetrating through the inorganic insulating film 36, the p-side electrode 13 is connected to the p-side interconnection layer 18 provided on the inorganic insulating film 36.

Also in the layout of FIG. 24, on the side surface 15c of the semiconductor layer 15, a metal film 41 is provided via the inorganic insulating film 36 and the metal film 42 described above. In FIG. 24, the metal film 42 is separated from the n-side interconnection layer 19. However, the metal film 42 may be connected to the n-side interconnection layer 19.

As shown in the sectional view of FIG. 13 or 19 described above, on the phosphor layer 40, a step portion 65 continued to the side surface 15c of the semiconductor layer 15 is provided. Also on the side surface 66 of the step portion 65, the metal film 41 is provided via the inorganic insulating film 36 and the metal film 42.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
   a semiconductor layer including a major surface, a side surface connected to the major surface, and a light emitting layer;
   a p-side electrode directly contacting the semiconductor layer on a major surface side of the semiconductor layer;
   an n-side electrode directly contacting the semiconductor layer on the major surface side of the semiconductor layer;
   an insulating film provided on the p-side electrode, the n-side electrode and the side surface of the semiconductor layer;
   a p-side interconnection section electrically connected to the p-side electrode through a p-side via penetrating through the insulating film;
   an n-side interconnection section electrically connected to the n-side electrode through an n-side via penetrating through the insulating film;
   a phosphor layer including a first portion and a second portion, the first portion being between the second portion and the semiconductor layer in a first direction, the first direction crossing the major surface of the semiconductor layer, the second portion covering the first portion in the first direction, a portion of the second portion extending beyond the first portion in a second direction crossing the first direction, a bottom surface of the portion of the second portion being connected to a side surface of the first portion, the side surface of the first portion being oblique to the bottom surface of the portion of the second portion; and
   a metal film provided on the side surface of the semiconductor layer via the insulating film, and on the side surface of the first portion of the phosphor layer via the insulating film, the insulating film being between the metal film and the portion of the second portion extending beyond the first portion, wherein
   the semiconductor layer is between the p-side electrode and the phosphor layer in the first direction, and between the n-side electrode and the phosphor layer in the first direction.

2. The device according to claim 1,
wherein the insulation film is an inorganic film and provided between the side surface of the semiconductor layer and the metal film and between the side surface of the first portion of the phosphor layer and the metal film.

3. The device according to claim 1, wherein the insulating film has a film thickness of half an emission wavelength of the light emitting layer.

4. The device according to claim 1, wherein the side surface of the semiconductor layer is oblique to the major surface.

5. The device according to claim 1, wherein the side surface of the first portion of the phosphor layer is oblique to the major surface.

6. The device according to claim 1, wherein the metal film is connected integrally with part of the n-side interconnection section.

7. The device according to claim 1, wherein the metal film contains aluminum.

8. The device according to claim 1, wherein
unevenness is formed on a surface of the semiconductor layer facing the phosphor layer, and
an adhesion layer is provided between, in the first direction, the semiconductor layer and the phosphor layer, the adhesion layer having an adhesive force with respect to the phosphor layer that is greater than an adhesive force between the phosphor layer and the semiconductor layer.

9. The device according to claim 1, wherein the phosphor layer is provided on the semiconductor layer without a substrate being interposed between the phosphor layer and the semiconductor layer.

10. The device according to claim 1, wherein a radiated light of the light emitting layer can be output in the first direction from the phosphor layer.

11. The device according to claim 1, further comprising a second insulating film provided between the phosphor layer and the semiconductor layer in the first direction.

12. The device according to claim 1, wherein
the metal film is provided on the major surface of the semiconductor layer via the insulating film, and
the semiconductor layer is provided between the metal film and the phosphor layer in the first direction.

13. The device according to claim 1, wherein
the p-side interconnection section includes:
    a p-side interconnect layer, and
    a p-side metal pillar; and
the n-side interconnection section includes:
    a n-side interconnect layer, and
    a n-side metal pillar.

14. The device according to claim 13, wherein the semiconductor layer is between, in the first direction, the p-side pillar and the phosphor layer, and between, in the first direction, the n-side pillar and the phosphor layer.

15. The device according to claim 1, wherein the semiconductor layer is between, in the first direction, the p-side interconnection section and the phosphor layer, and between, in the first direction, the n-side interconnection section and the phosphor layer.

16. The device according to claim 1, further comprising a resin provided between the p-side interconnection section and n-side interconnection section.

17. The device according to claim 16, wherein the semiconductor layer is provided between, in the first direction, the resin and the phosphor layer.

18. The device according to claim 16, wherein
the resin is provided on the side surface of the semiconductor layer, and,
in the second direction, the metal film is between the first portion of the phosphor layer and the resin on the side surface of the semiconductor layer.

19. A semiconductor light emitting device comprising:
a semiconductor layer including a major surface, a side surface connected to the major surface, and a light emitting layer;
a p-side electrode directly contacting the semiconductor layer on a major surface side of the semiconductor layer;
an n-side electrode directly contacting the semiconductor layer on the major surface side of the semiconductor layer;
an insulating film provided on the p-side electrode, the n-side electrode and the side surface of the semiconductor layer;
a p-side interconnection section electrically connected to the p-side electrode through a p-side via penetrating through the insulating film;
an n-side interconnection section electrically connected to the n-side electrode through an n-side via penetrating through the insulating film;
a phosphor layer including a first portion and a second portion, the first portion being between the second portion and the semiconductor layer in a first direction, the first direction crossing the major surface of the semiconductor layer, the second portion covering the first portion in the first direction and a portion of the second portion extending beyond the first portion in a second direction crossing the first direction, a bottom surface of the portion of the second portion being connected to a side surface of the first portion, the side surface of the first portion being oblique to the bottom surface of the portion of the second portion;
an inorganic insulating film on the side surface and the major surface of the semiconductor layer, the inorganic insulating film extending from the major surface of the semiconductor layer along the side surface of the semiconductor layer and the side surface of the first portion of the phosphor layer; and
a metal film provided on the side surface of the semiconductor layer via the inorganic insulating film, and on the side surface of the first portion of the phosphor layer via the inorganic insulating film, the inorganic insulating film being between the metal film and the portion of the second portion extending beyond the first portion, wherein
the semiconductor layer is between the p-side electrode and the phosphor layer, in the first direction, and between the n-side electrode and the phosphor layer in the first direction.

20. The device according to claim 19, wherein the inorganic insulating film has a film thickness of half an emission wavelength of the light emitting layer.

21. The device according to claim 19, wherein the side surface of the semiconductor layer is oblique to the major surface.

22. The device according to claim 19, wherein the side surface of the first portion of the phosphor layer is oblique to the major surface.

23. The device according to claim 19, wherein the metal film is connected integrally with part of the n-side interconnection section.

24. The device according to claim 19, wherein the metal film contains aluminum.

25. The device according to claim 19, wherein
unevenness is formed on a surface of the semiconductor layer facing the phosphor layer, and
an adhesion layer is provided between, in the first direction, the semiconductor layer and the phosphor layer, the adhesion layer having an adhesive force with respect to the phosphor layer that is greater than an adhesive force between the phosphor layer and the semiconductor layer.

26. The device according to claim 19, wherein the phosphor layer is provided on the semiconductor layer without a substrate being interposed between the phosphor layer and the semiconductor layer.

27. The device according to claim 19, wherein a radiated light of the light emitting layer can be output in the first direction from the phosphor layer.

28. The device according to claim 19, further comprising a second insulating film provided between the phosphor layer and the semiconductor layer in the first direction.

29. The device according to claim 19, wherein
the metal film is provided on the major surface of the semiconductor layer via the inorganic insulating film, and
the semiconductor layer is provided between the metal film and the phosphor layer in the first direction.

30. The device according to claim 19, wherein
the p-side interconnection section includes:
a p-side interconnect layer, and
a p-side metal pillar; and
the n-side interconnection section includes:
a n-side interconnect layer, and
a n-side metal pillar.

31. The device according to claim 30, wherein the semiconductor layer is between, in the first direction, the p-side pillar and the phosphor layer, and between, in the first direction, the n-side pillar and the phosphor layer.

32. The device according to claim 19, wherein the semiconductor layer is between, in the first direction, the p-side interconnection section and the phosphor layer, and between, in the first direction, the n-side interconnection section and the phosphor layer.

33. The device according to claim 19, further comprising a resin provided between the p-side interconnection section and n-side interconnection section.

34. The device according to claim 33, wherein the semiconductor layer is provided between, in the first direction, the resin and the phosphor layer.

35. The device according to claim 33, wherein
the resin is provided on the side surface of the semiconductor layer, and,
in the second direction, the metal film is between the first portion of the phosphor layer and a portion of the resin disposed on the side surface of the semiconductor layer.

36. A semiconductor light emitting device, comprising:
a semiconductor layer including a first semiconductor layer, a second semiconductor layer and a light emitting layer, the first semiconductor layer having a first surface, a second surface opposite to the first surface, the second semiconductor layer having a third surface facing the second surface and a fourth surface opposite to the third surface, the light emitting layer provided between the first surface and the fourth surface in a first direction crossing the first surface;
a p-side electrode contacting the fourth surface;
an n-side electrode contacting the second surface;
an insulating film provided on the p-side electrode, the n-side electrode and a side surface of the semiconductor layer;
a p-side interconnection section electrically connected to the p-side electrode through a p-side via penetrating through the insulating film;
an n-side interconnection section electrically connected to the n-side electrode through an n-side via penetrating through the insulating film;
a phosphor layer provided on the first surface, the phosphor layer including a first portion and a second portion, the first portion provided on the first surface, the second portion provided on the first portion, the first portion having a fifth surface facing the first surface, the first portion having a side surface continued from the fifth surface, and the first portion being between the second portion and the first surface in the first direction, a width of the second portion in a second direction perpendicular to the first direction being greater than a width of the first portion in the second direction, a bottom surface of a portion of the second portion that is extending beyond the first portion in the second direction, the bottom surface of the portion being connected to the side surface of the first portion, the side surface of the first portion being oblique to the bottom surface of the portion; and
a metal film provided on the side surface of the semiconductor layer, via the insulating film, and on the side surface of the first portion of the phosphor layer, the side surface of the first portion being in direct contact with the insulating film, the insulating film being between, in the first direction, the metal film and the portion of the second portion extending beyond first portion.

37. The device according to claim 36, further comprising a second insulating film provided between the phosphor layer and the first surface of the first semiconductor layer.

38. The device according to claim 36, wherein the metal film is provided on the second surface of the first semiconductor layer.

39. The device according to claim 36, wherein the insulating film is between the side surface of the semiconductor layer and the metal film and between the side surface of the first portion of the phosphor layer and the metal film.

40. The device according to claim 39, wherein the insulating film has a film thickness of half an emission wavelength of the light emitting layer.

41. The device according to claim 36, wherein the side surface of the semiconductor layer is oblique to the first surface of the first semiconductor layer.

42. The device according to claim 36, wherein the side surface of the first portion of the phosphor layer is oblique to the first surface of the first semiconductor layer.

43. The device according to claim 36, wherein the metal film is connected integrally with part of the n-side interconnection section.

44. The device according to claim 36, wherein the metal film contains aluminum.

45. The device according to claim 36, wherein
unevenness is formed on the first surface of the first semiconductor layer, and
an adhesion layer is provided between the first surface and the phosphor layer, the adhesion layer having an adhesive force with respect to the phosphor layer that is greater than an adhesive force between the phosphor layer and the first semiconductor layer.

* * * * *